United States Patent
Hidaka

(10) Patent No.: US 7,193,856 B2
(45) Date of Patent: Mar. 20, 2007

(54) EJECTOR, UNIT AND ELECTRONIC APPARATUS HAVING THE SAME

(75) Inventor: Hiroshi Hidaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/998,554

(22) Filed: Nov. 30, 2004

(65) Prior Publication Data

US 2006/0039106 A1  Feb. 23, 2006

(30) Foreign Application Priority Data

Aug. 20, 2004  (JP) ............................. 2004-241231

(51) Int. Cl.
| | |
|---|---|
| H05K 7/16 | (2006.01) |
| A47B 97/00 | (2006.01) |
| A47B 47/00 | (2006.01) |
| A47F 7/00 | (2006.01) |

(52) U.S. Cl. ................ 361/725; 312/332.1; 312/223.1; 211/190

(58) Field of Classification Search ............. 312/332.1, 312/294; 361/724–727, 685, 798, 754; 211/26
See application file for complete search history.

(56) References Cited

U.S. PATENT DOCUMENTS

| | | | | | |
|---|---|---|---|---|---|
| 5,740,012 | A | * | 4/1998 | Choi | .......................... 361/686 |
| 5,793,614 | A | * | 8/1998 | Tollbom | ..................... 361/732 |
| 5,912,799 | A | * | 6/1999 | Grouell et al. | .............. 361/685 |
| 6,067,225 | A | * | 5/2000 | Reznikov et al. | ........... 361/685 |
| 6,288,902 | B1 | * | 9/2001 | Kim et al. | ................... 361/725 |
| 6,292,360 | B1 | * | 9/2001 | Carteau | ...................... 361/685 |
| 6,378,965 | B1 | * | 4/2002 | Reznikov et al. | ........ 312/332.1 |
| 6,381,139 | B1 | * | 4/2002 | Sun | ............................. 361/725 |
| 6,392,884 | B1 | * | 5/2002 | Chou | ......................... 361/687 |
| 6,606,256 | B1 | * | 8/2003 | Lee et al. | .................... 361/825 |
| 6,608,750 | B2 | * | 8/2003 | Cruz et al. | .................. 361/685 |
| 6,678,162 | B2 | * | 1/2004 | Chewning | ................... 361/726 |
| 6,852,341 | B2 | * | 2/2005 | Rodriguez-Kabana | ...... 424/719 |
| 6,906,914 | B2 | * | 6/2005 | Stamos et al. | ............. 361/683 |
| 2002/0181197 | A1 | * | 12/2002 | Huang | ........................ 361/685 |
| 2003/0147220 | A1 | * | 8/2003 | Fairchild | .................... 361/726 |

FOREIGN PATENT DOCUMENTS

| | | |
|---|---|---|
| JP | 05-259655 | 10/1993 |
| JP | 2004-054967 | 2/2004 |

* cited by examiner

Primary Examiner—Lisa Lea-Edmonds
Assistant Examiner—Zachary Pape
(74) Attorney, Agent, or Firm—Staas & Halsey LLP

(57) ABSTRACT

An ejector includes a block attached rotatably to a unit, the block including first and second compression members, each of which compresses an electronic apparatus so as to release an electric connection between the unit and the electronic apparatus, and an arm rotatable with the block and attached to the unit so that the arm displaces relative to the block, the arm including third and fourth compression members, each of which compresses an electronic apparatus so as to electrically connect the unit and the electronic apparatus to each other, wherein the block and the arm compress the electronic apparatus via different compression members as a displacement state and a rotational direction of the arm change.

19 Claims, 23 Drawing Sheets

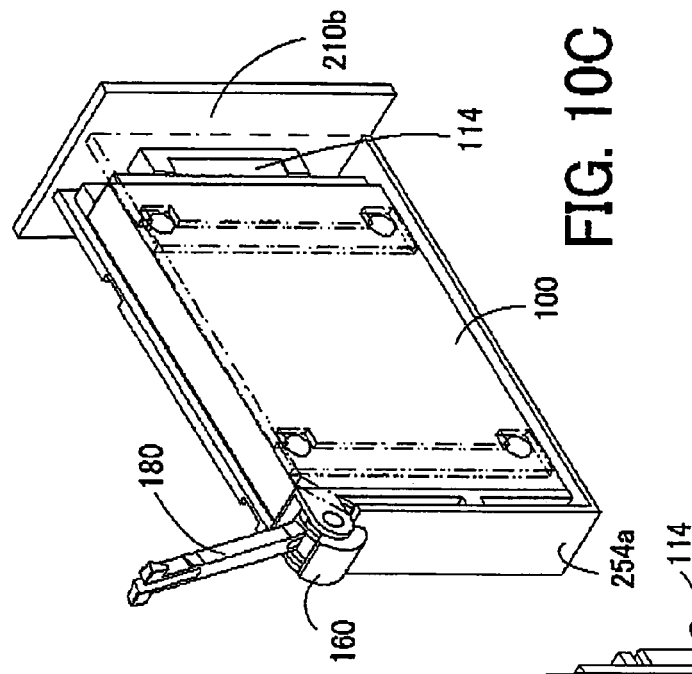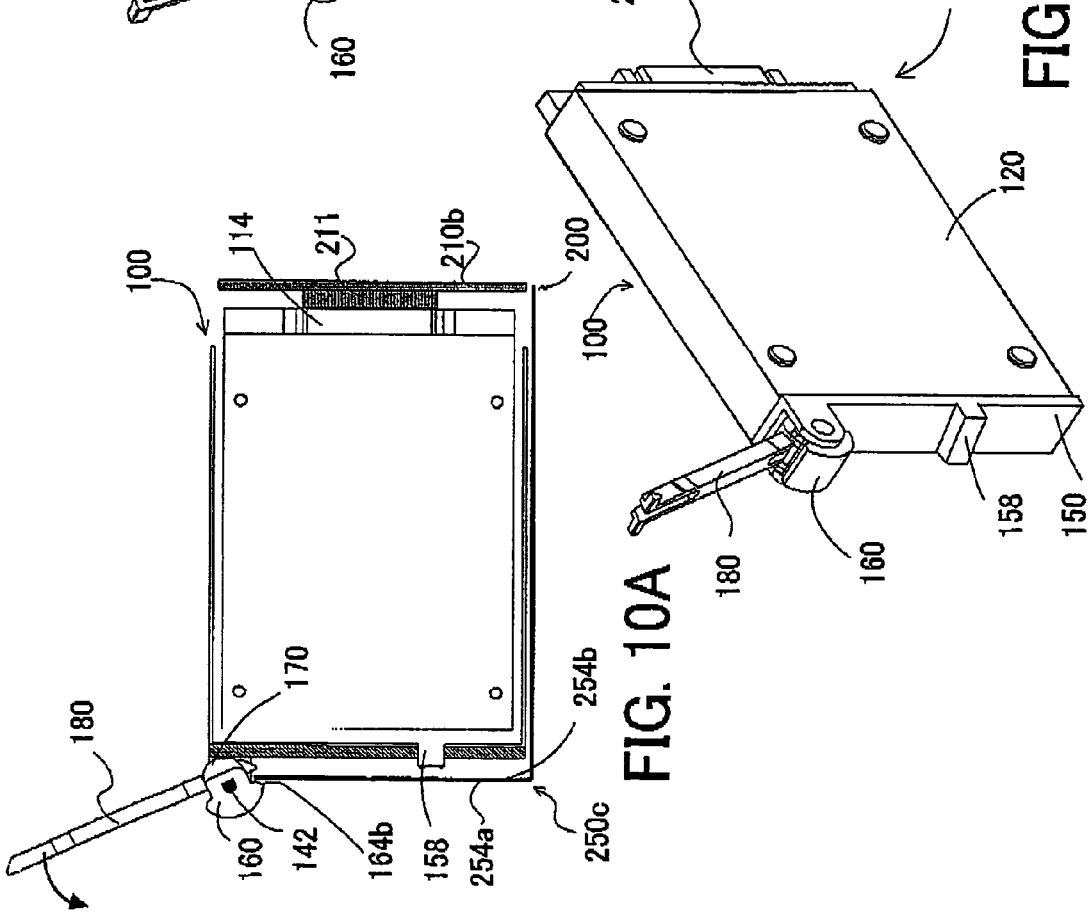

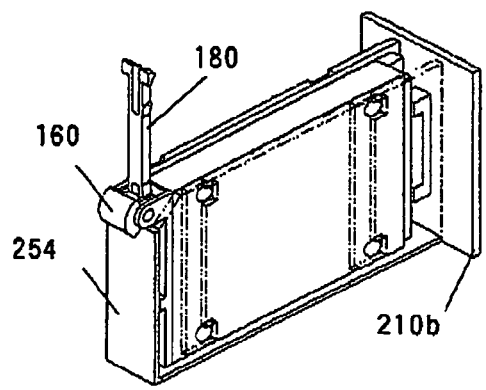
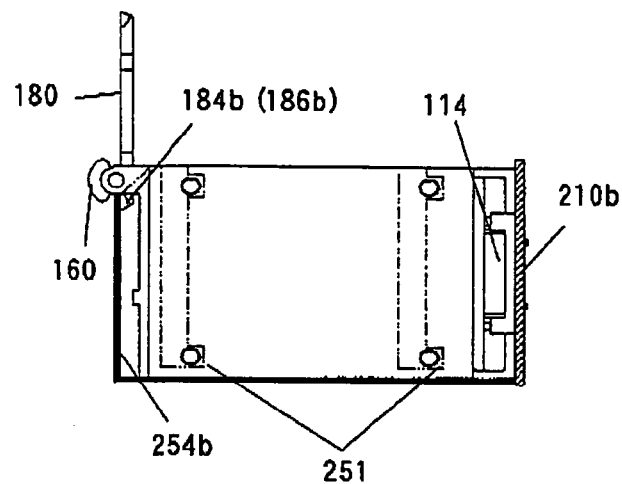
FIG. 20A    FIG. 20B
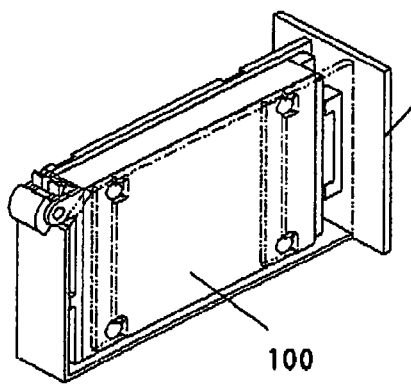
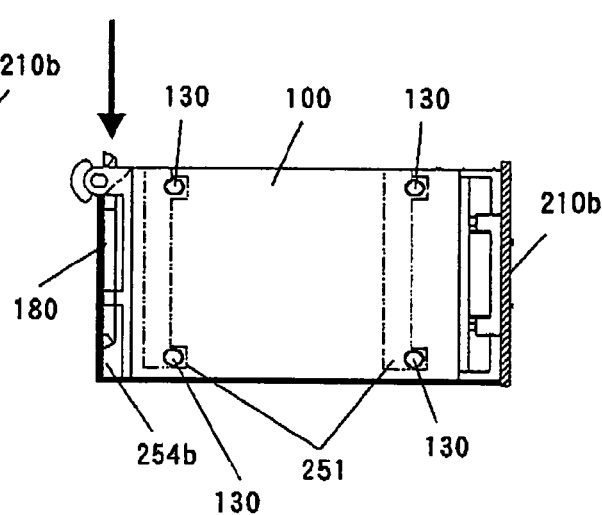
FIG. 21A    FIG. 21B

PRIOR ART

EJECTOR, UNIT AND ELECTRONIC APPARATUS HAVING THE SAME

This application claims the right of foreign priority under 35 U.S.C. § 119 based on Japanese Patent Application No. 2004-241231 filed on Aug. 20, 2004, which is hereby incorporated by reference herein in its entirety as if fully set forth herein.

BACKGROUND OF THE INVENTION

The present invention relates generally to a unit and an electronic apparatus to which the unit is removably attached, and an ejector mechanism that loads the unit into and ejects the unit from the electronic apparatus. The present invention is suitable, for example, for a disc array storage that removably installs plural hard disc drive ("HDD") units.

The disc array storage that removably installs one or more HDD units has been recently proposed as a fast, large-capacity and highly reliable external storage (see for example, Japanese Patent Application, Publication No. 2004-54967). The disc array storage allows only a HDD unit that requires maintenance, to be exchanged while keeping a running state of the entire apparatus.

FIG. 27 shows a conventional exemplary disc array storage 10 and HDD unit 20 attachable to it. Here, FIG. 12 is a schematic perspective view of the disc array storage 10 and the HDD unit 20. The disc array storage 10 arranges the HDD units 20 via a back panel 14 in front of a housing 12 indicated by an alternate long and two short dashes line, and an interface (I/F) unit 16 and a power supply unit 18 at its back. Since each HDD unit 20 is exchanged while the disc array storage 10 is mounted on a rack, each unit is configured to be inserted and ejected in an L direction.

Other prior art include Japanese Patent Application, Publication No. 5-259655.

Recently, as an amount of available information through the Internet increases, a large-capacity storage is required Therefore, the disc array storage 10 is requested to install more HDD units 20. Accordingly, the instant inventor has studied an increase of the number of rows of HDD units 20 in the L direction in FIG. 27.

Where two rows of HDD units 20 are installed, one conceivable method for loading the HDD units 20 into the inner row is that a user inserts the HDD units 20 inside the housing 12 through an opening of the housing 12. This method, however, requires the user to insert his hand deeply inside with bad operability, and the user's hand may be injured inside the housing 12. In addition, since the back panel 14 is provided on the rear surface side of the HDD unit 20, and one possible configuration of the two rows will be in order of the HDD unit 20, the back panel 14, the HDD unit 20 and the back panel 14. Therefore, the front back panel 14 prevents the insertion of the inner HDD unit 20 in the L direction.

The instant inventor then studied a method for inserting the front HDD units 20 in the L direction as conventional and for inserting the inner HDD units 20 from the top. This structure solves the above problem, but requires an electric connection/disconnection mechanism between the inner HDD unit 20 and the inner back panel 14. The HDD unit 20 has a connector at its rear surface, which is connectible to the back panel 14. Therefore the inner HDD unit 20 is inserted into the housing 12 from the top, and then moved in the L direction for the connector's connection. The connector's disconnection should be prior to the ejection of the inner HDD unit 20. Since it is difficult to keep a sufficient space for a user's finger in the accommodation space for the inner HDD unit 20 due to the miniaturization demand of the housing 12, the HDD unit 20 should possess the electric connection/disconnection mechanism for the connector. In addition, the uniform manufacturing is preferable, and thus the front HDD unit 20 and the inner AD unit 20 need to have the same ejector mechanism. Therefore, the mechanism for the inner HDD unit 20 should serve as the electric connection/disconnection mechanism for the connector of the front HDD unit. The ejector mechanism itself has preferably a simple structure.

BRIEF SUMMARY OF THE INVENTION

Accordingly, it is an exemplary object to provide a small ejector that attaches each of units of plural rows to and ejects that unit from the electronic apparatus, the unit having this ejector, and the electronic apparatus that removably accommodates the unit.

An ejector according to one aspect of the present invention includes a block attached rotatably to a unit, the block including first and second compression members, each of which compresses an electronic apparatus so as to release an electric connection between the unit and the electronic apparatus, and an arm rotatable with the block and attached to the unit so that the arm displaces relative to the block, the arm including third and fourth compression members, each of which compresses an electronic apparatus so as to electrically connect the unit and the electronic apparatus to each other, wherein the block and the arm compress the electronic apparatus via different compression members as a displacement state and a rotational direction of the arm change. This ejector provides an electric connection and disconnection between the unit and the electronic apparatus at two points, and is therefore commonly used for the units that are inserted into and ejected from the electronic apparatus in different directions. Since the arm serves as a power point and an action point, the multifunction saves the number of components and makes the ejector small.

For example, the arm is displaceable between first and second positions relative to the unit, wherein as the arm rotates from the first position in a first direction, the first compression member of the block compresses the electronic apparatus, and as the arm rotates from the first position in a second direction opposite to the first direction, the third compression member of the arm compresses the electronic apparatus, and wherein as the arm rotates from the second position in a third direction, the second compression member of the block compresses the electronic apparatus, and as the arm rotates from the second position in a fourth direction opposite to the third direction, the fourth compression member of the arm compresses the electronic apparatus.

Preferably, the ejector further includes a lock member that locks the arm at the first and second positions relative to the unit, and an unlock member that releases a lock by the lock member. This structure provides stable electric connection and disconnection between the unit and the electronic apparatus.

The lock member includes, for example, a fixing member attached to the unit, and an engagement member engageable with the fixing member and formed on the arm, wherein the unlock member has an elastically deformable X shape that enables the arm, for example) to deform and releases an engagement between the fixing member and engagement member. The block may have a T-shaped or mushroom-shaped section.

The arm is, for example, a rod-shaped member, one end of the arm at the first position being engaged with the block, the other end of the arm at the second position being engaged with the block. The third direction may be the second direction, and the fourth direction may be the first direction. For example, the first and third compression members contact front and back surface of the electronic apparatus, and the second and fourth compression members contact front and back surface of the electronic apparatus. The ejector further includes a rotation restricting member that restricts a rotation of the arm towards the unit. This structure prevents an excessive force from being applied to the connectors of the unit and the electronic apparatus.

The ejector further may include a rotation restricting member, such as an inclined surface, that restricts a rotation of the arm by contacting the unit or a member fixed onto the unit. This structure enables the unit, for example, to be ejected from the electronic apparatus, while the inclination angle between the arm and the unit is maintained constant, the operability improves.

An ejector according to another aspect of the present invention includes a first member that includes two operational members located at different positions, and compresses an electronic apparatus using one of the two operational members so as to release an electric connection between a unit and the electronic apparatus, and a second member that includes two other operational members located at different positions, and compresses an electronic apparatus using one of the two other operational members so as to electrically connect the unit and the electronic apparatus to each other. This ejector provides an electric connection and disconnection between the unit and the electronic apparatus at two points, and is therefore commonly used for the units that are inserted into and ejected from the electronic apparatus in different directions.

A unit having the above ejector also constitutes one aspect of the present invention.

An electronic apparatus according to another aspect of the present invention that accommodates plural units in at least two rows, the units of the at least two rows being inserted into and ejected from the electronic apparatus in orthogonal directions, includes a first back panel electrically connectible to a unit in a first row, a second back panel electrically connectible to a unit in a second row, a third back panel electrically connectible to the second back panel, and a relay board that connects the first back panel to the third back panel, wherein power is supplied to each the units in the first and second rows via the third back panel and signals are transmitted between the third back panel and each of the units in the first and second rows. This electronic apparatus supplied the power to the units in the first and second rows via the third back panel, and allows signals to be transmitted between these units and the third back panel. The first, second and third back panels may be arranged substantially parallel to each other. The unit may include the above ejector. The electronic apparatus may further include a fixing member that fixes the arm when the unit is loaded into the electronic apparatus. This structure prevents the arm from vibrating and provides stable electric connection between the unit and the electronic apparatus. The unit may include a first engagement member on a surface parallel to a longitudinal direction of the unit, wherein the electronic apparatus may further include a first guide that is engageable with the unit in the first row and guides the unit in the first row in the longitudinal direction of the unit, a second engagement member engageable with the first engagement member, and a second guide that is engageable with the unit in the second row and guides the unit in the second row in a direction perpendicular to the longitudinal direction of the unit.

A rack mount unit that removably accommodates the above electronic apparatus also constitutes another aspect of the present invention.

Other objects and further features of the present invention will become readily apparent from the following description of the preferred embodiments with reference to accompanying drawings.

BRIEF DESCRIPTION OF THE DRAWINGS

FIG. 10A is a sectional view and FIGS. 10B and 10C are perspective views of the HDD unit that advances the ejection action shown in FIGS. 9A, 9B and 9C.

FIGS. 20A and 20B are perspective and sectional views of the HDD unit that advances the ejection action shown in FIGS. 19A and 19B.

FIGS. 21A and 21B are perspective and sectional views of the HDD unit that advances the ejection action shown in FIGS. 20A and 20B.

DETAILED DESCRIPTION OF THE PREFERRED EMBODIMENTS

Figure 1:
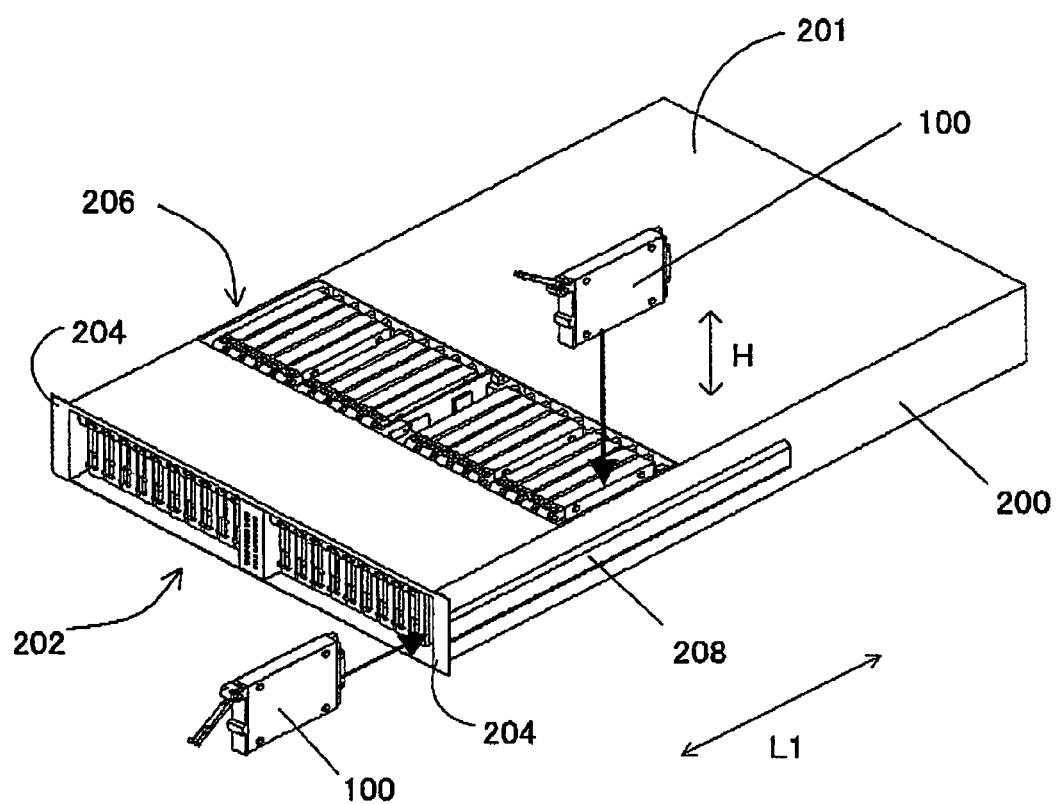
FIG. 1 is a perspective overview of a disc array storage according to one embodiment of the present invention, into which a HDD unit is loaded.
Figure 22:
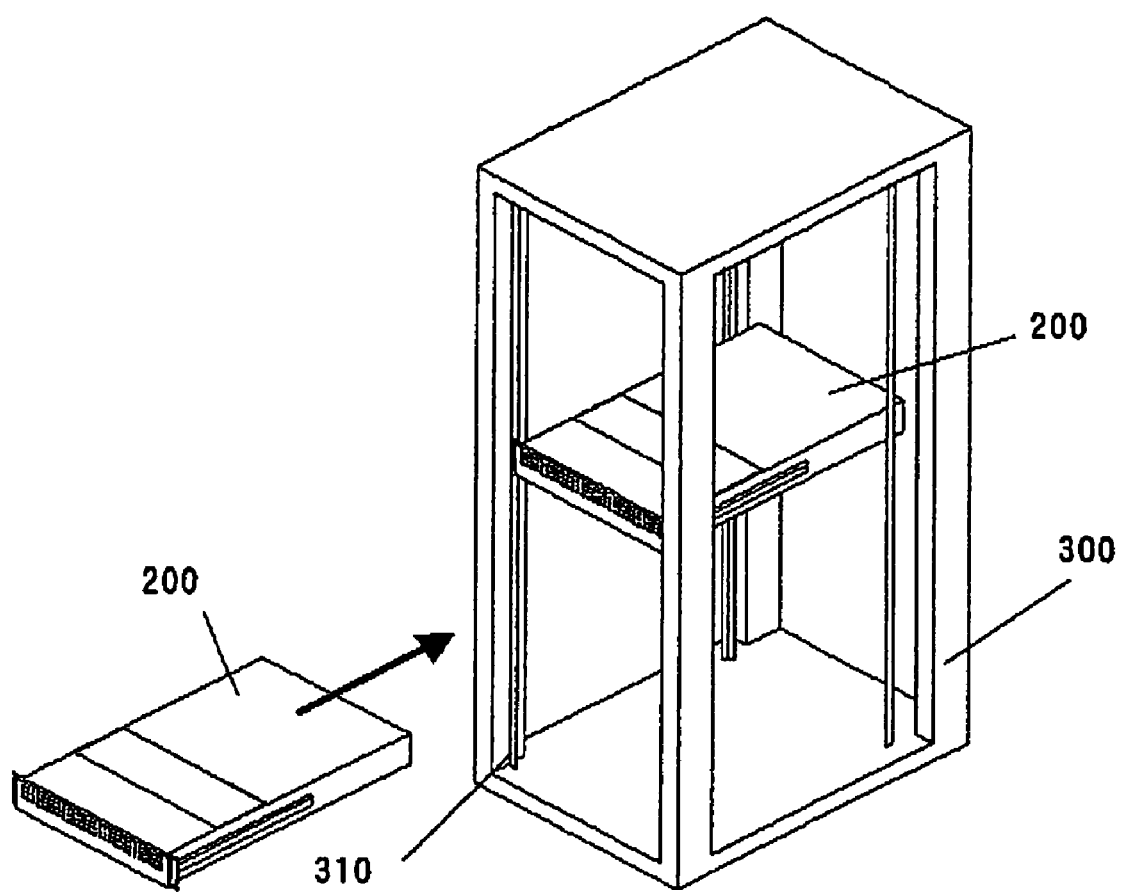
FIG. 22 is a perspective view of a rack mount unit, into which the disc array storage shown in FIG. 1 is loadable.

A description will be given of a HDD unit 100, a disc array storage 200 that can mount the HDD units 100 in plural rows, and a rack mount unit 300 that can mount plural disc array storages 200 in plural stages according to one embodiment of the present invention, with reference to the accompanying drawings. A description will now be given of the disc array apparatus 200 and the rack mount unit 300 with reference to FIGS. 1, 22 to 26. Here, FIG. 1 is a perspective overview of the HDD unit 100. FIG. 22 is a perspective view showing a relationship between the disc array storage 200 and the rack mount unit 300.

The disc array storage 200 is a big computer that serves as an auxiliary storage used mainly for data backup. The rack mount unit 300 removably accommodates disc array storages in plural stages, and serves as a large-capacity storage. The disc array unit 200 includes a housing 201 that has an approximately rectangular parallelopiped shape that removably accommodates the HDD units 100 in plural rows, circuit board or units 210a to 240 that are electrically connected to the HDD unit 100, and guides 250a to 250c that guide the HDD unit 100.

Referring to FIGS. 1 and 22, the housing 201 has a front opening 202, a pair of projections 204, a top opening 206, and a pair of slide rails 208 on both side surfaces. The HDD unit 100 in the front row is attached and ejected through the opening 202 in the L direction as shown in FIG. 1. A pair of projections 204 are screwed onto a pair of attachment portions that are perpendicularly provided on the rack mount unit 300, whereby the disc array storage 200 is screwed onto the rack mount unit 300. The HDD unit 100 in the second row is attached and ejected through the opening 202 in the H direction as shown in FIG. 1. A pair of slide rails 208 are engaged with a pair of concave guide grooves (not shown) provided to each stage of the rack mount unit 300, and guide the housing 201 that is inserted into and ejected from the rack mount apparatus 300. While the instant embodiment provides the housing 201 with the slide rails 208 and the rack mount unit 300 with the guide grooves, the rack mount unit 300 may have rails and the housing 201 may have guide grooves.

Figure 23A:
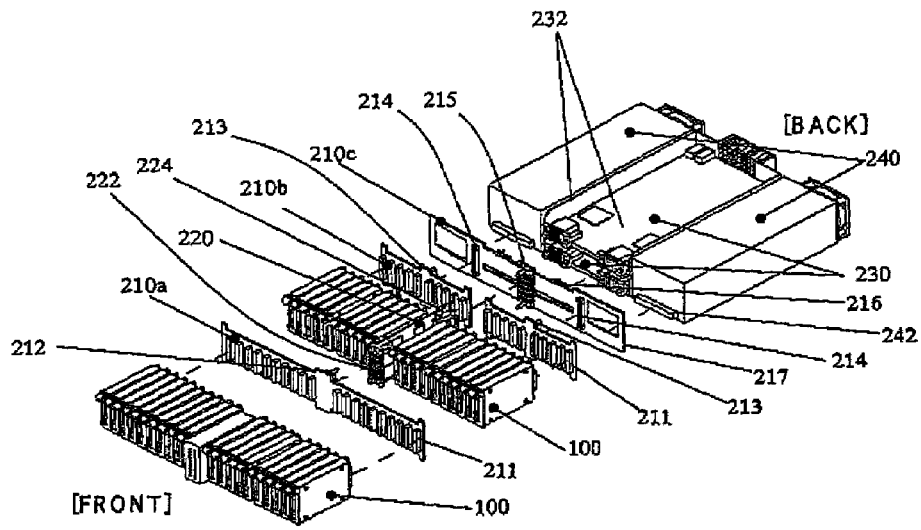
FIGS. 23A and 23B are an exploded perspective view and a block diagram of an internal structure of the disc array storage shown in FIG. 1.
Figure 23B:
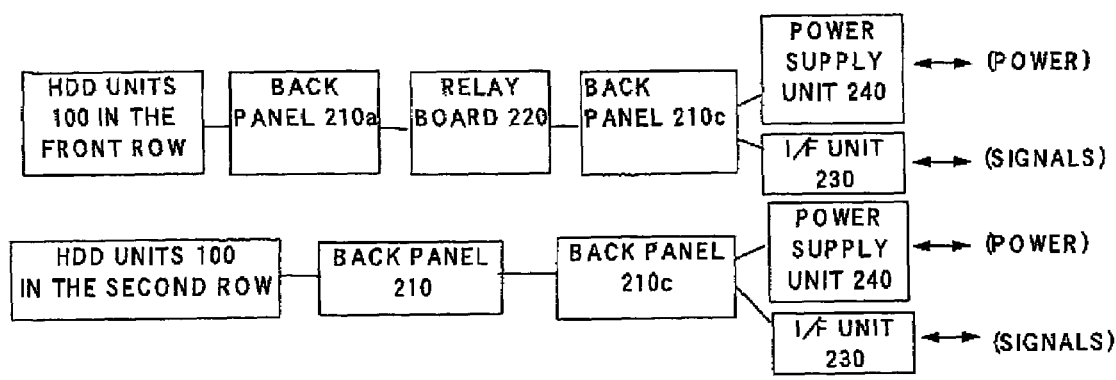

As shown in FIGS. 23A and 23B, the disc array storage 200 includes, from the front to the back, the HDD units 100 in the front row, the back panel 210a, the HDD units 100 in the second row, a relay board 220 arranged between the HDD units 100 in the second row, a pair of back panels 210b, a back panel 210c, a pair of I/F units 230, and a pair of power supply units 240. It is exemplary that the number of rows of the HDD units is two. Here, FIGS. 23A and 23B are an exploded perspective view and a block diagram of the internal structure of the disc array storage 200. The back panels 210a to 210c are arranged parallel to each other.

The back panel 210a has plural connectors 211 on its front surface, and each connector 211 is connected to the HDD unit 100 in the front row. The back panel 210a has a connector 212 at the center on the back surface, and the connector 212 is connected to a connector 222 on the front surface of the relay board 220. The relay board 220 has the connector 222 on its front surface, and a connector 224 on its rear surface. Each of the pair of back panels 210b has plural connectors 211 on its front surface, and each connector 211 is connected to the HDD unit 100 in the second row. Each back panel 210b has a connector 213 on its rear surface, which is connected to one of a pair of connectors 214 provided on the front surface at the both sides of the back panel 210c. The back panel 210c further includes a connector 215 at the center of its front surface, four connectors 216 on the rear surface, and a pair of connectors 217. The connector 215 is connected to the connector 224 of the relay board 220. Each connector 216 is connected to a connector 232 of the I/F unit 230. The connector 217 is connected to the connector 242 of the power supply unit.

As a result, as shown in FIG. 23B, the HDD units 100 in the front row are connected to the back panel 210a, which is, in turn, connected to the relay board 220, which is, in turn, connected to the back panel 210c. The HDD units 100 in the inner row are connected to the back panel 210b, which is, in turn, connected to the back panel 210c. The back panel 210c is connected to the I/F unit 230 and the power supply unit 240. The power is supplied to the HDD units 100 via the back panel 210c, and signals are transmitted between the HDD units 100 and the disc array storage 200.

Figure 24:
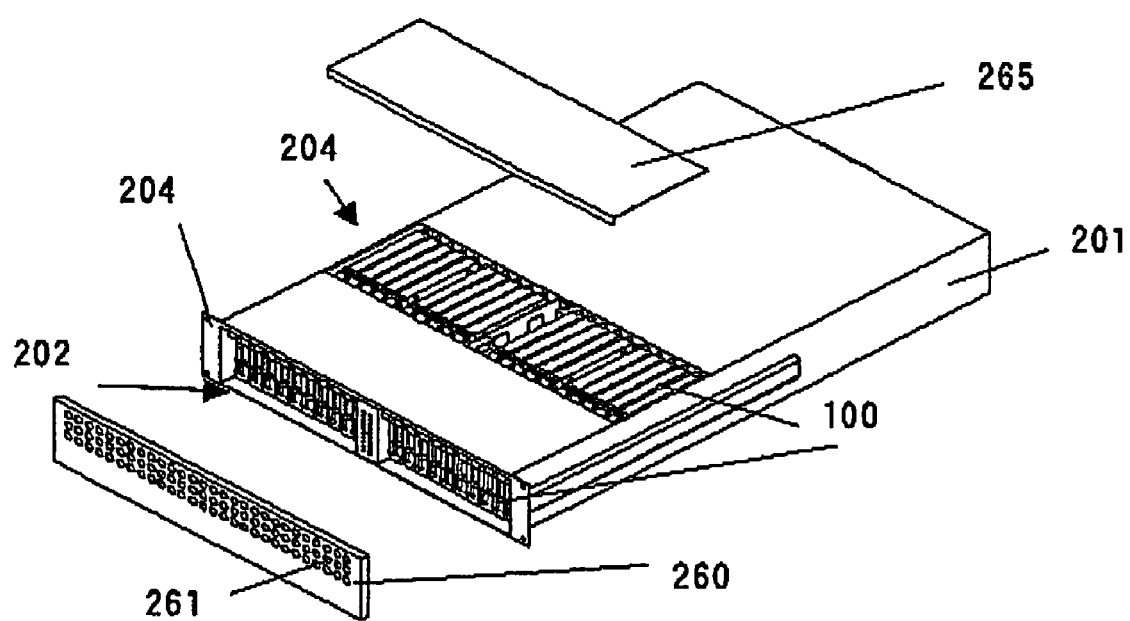
FIG. 24 is a perspective overview of covers attachable to the disc array storage shown in FIG. 1.

As shown in FIG. 24, a front cover 260 is attached to the opening 202 and a top cover 265 is attached to the opening 204 in the disc array storage 200. Here, FIG. 24 is a perspective overview showing the covers 260 and 265 attachable to and detachable from the disc array storage 200. In FIG. 24, the front cover 260 has radiation holes 261, but the top cover 265 may have these radiation holes 261. The covers 260 and 265 protect the insertion/ejection surfaces for the HDD units 100.

Figure 25A:
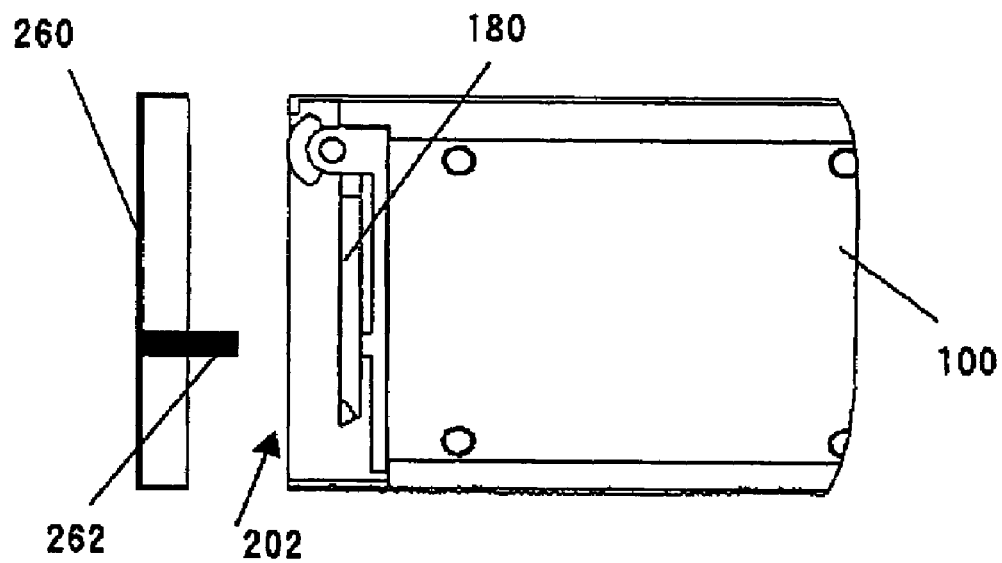
FIGS. 25A and 25B are perspective overviews showing an fixing member provided on a front cover shown in FIG. 23.
Figure 25B:
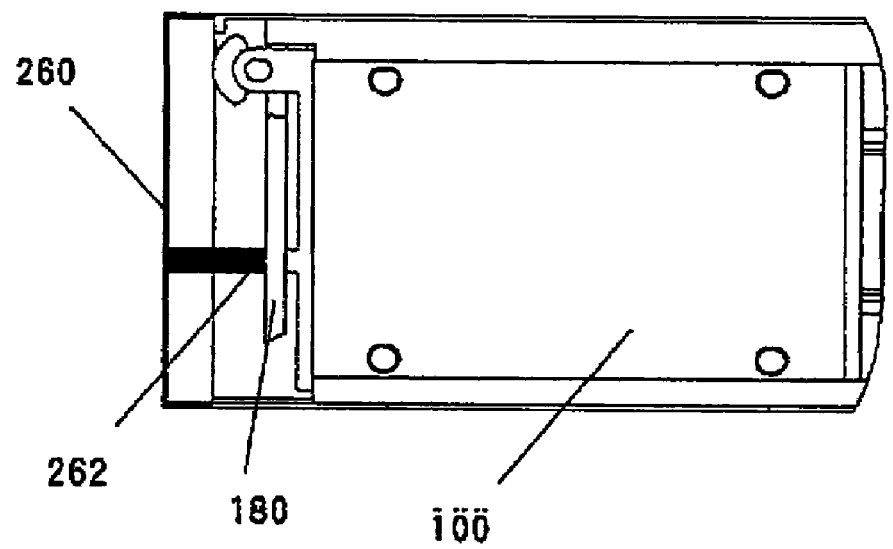

As shown in FIGS. 25A and 25B, the front cover 260 may have a fixing member 262. Here, FIG. 25A is a sectional view before the front cover 260 having the fixing member 262 is attached, and FIG. 25B is a sectional view after the front cover 260 having the fixing member 262 is attached. The fixing member 262 is made, for example, of a projection that presses an arm 180 of an ejector 140, which will be described later. This configuration prevents the arm 180 from vibrating within a predetermined angular range, for example, from 0° to 20°, and maintain the stable electric connection between the connectors 114 and 211, which will be described later.

Figure 26:
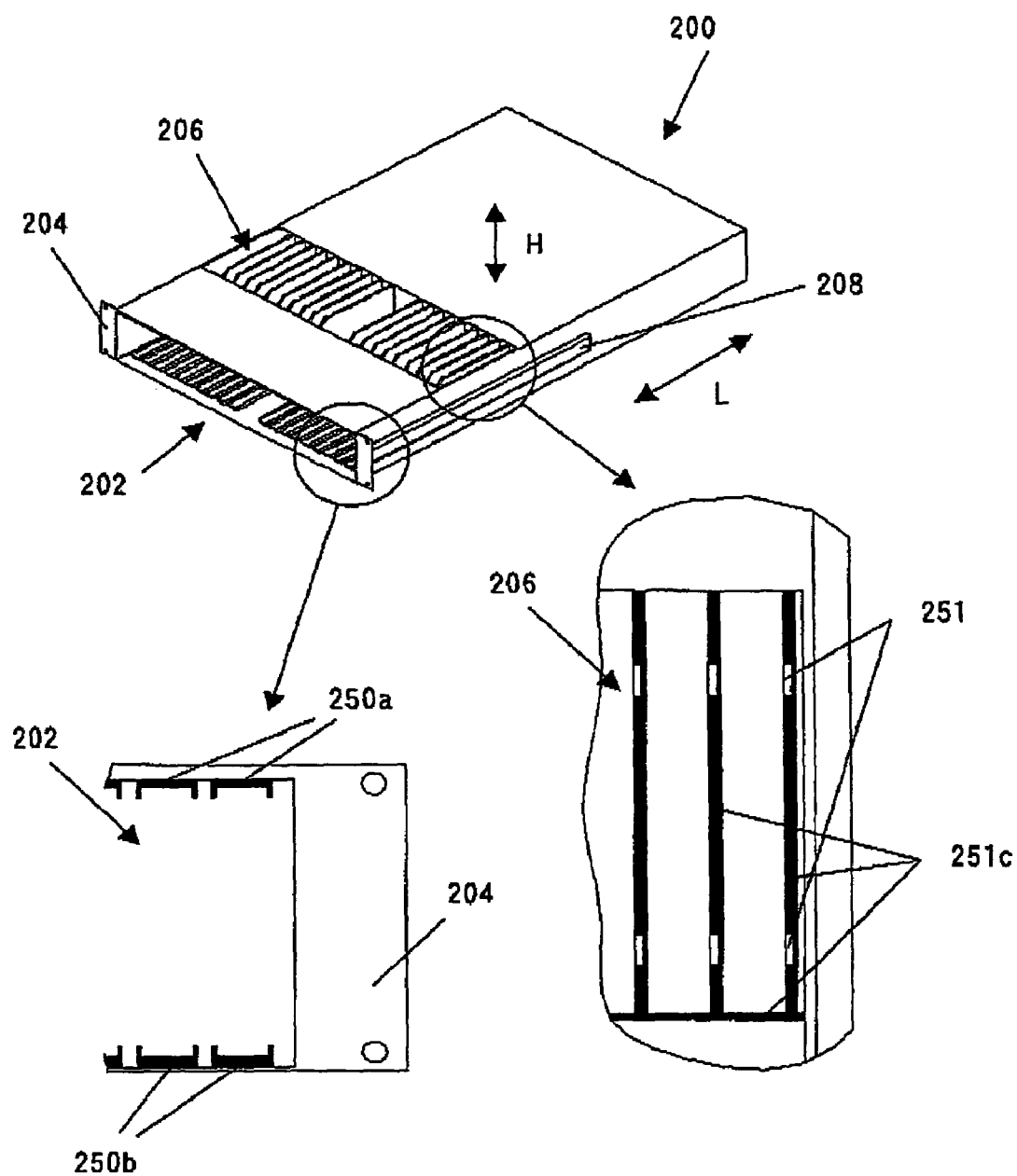
FIG. 26 is a partially enlarged perspective view showing a guide of the disc array storage shown in FIG. 1.
Figure 27:
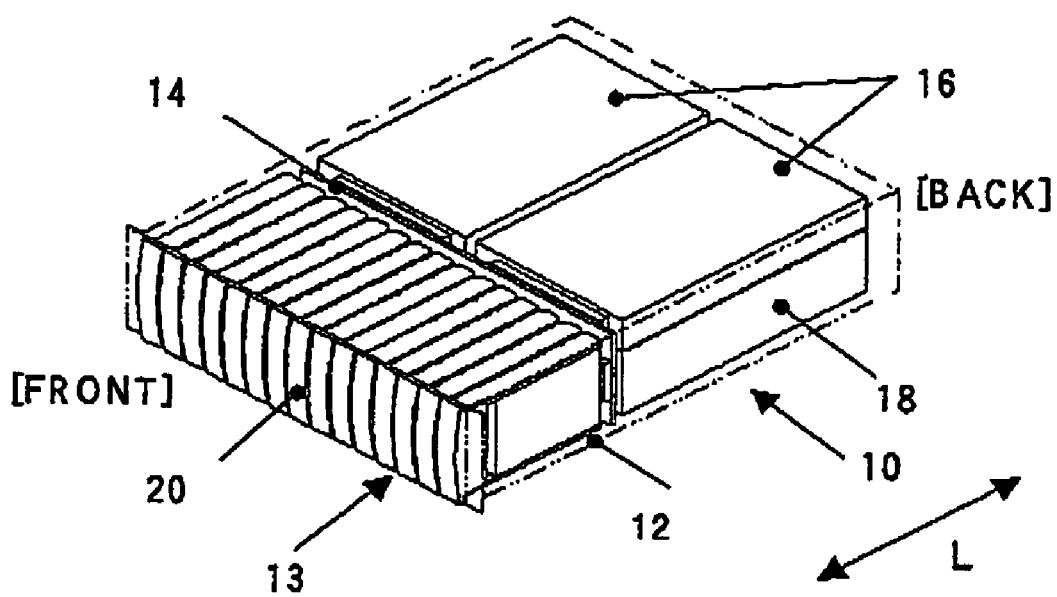
FIG. 27 is a schematic perspective view of a conventional disc array storage and HDD unit.

As shown in FIG. 26, the guides 250a to 250c position and guide the HDD units 100 to assist their insertions and ejections. FIG. 26 is a partially enlarged perspective view showing guides 250 of the disc array storage 200. A pair of guides 250a and 250b are aligned with a vertical direction and extend in the L direction from the opening 202 for each HDD unit 100 in the front row. The guides 250c extend in the H direction for each HDD unit 100 in the second row. The reference numeral 250 generalizes 250a, etc. in the instant specification.

The guides 250a and 250b each have a concave section that matches the shape of the HDD unit 100 in the front row. While the instant embodiment forms the guides 250a and 250b in a concave shape, these guides 250 may be convexly formed and the HDD unit 100 may be concavely formed.

A pair of adjacent guides 250c define an area for insertion and ejection of the HDD unit in the second row. The guide 250c has L-shaped guide grooves 251, as shown in FIG. 21, for accepting screw heads of the screws 130. The HDD unit 100 in the second row is positioned by the engagement between the screws 130 and the guide grooves 251. Each L-shaped guide groove 251 allows the HDD unit in the second row to move in the L direction after the screws 130 are inserted into the H direction.

Figure 2:
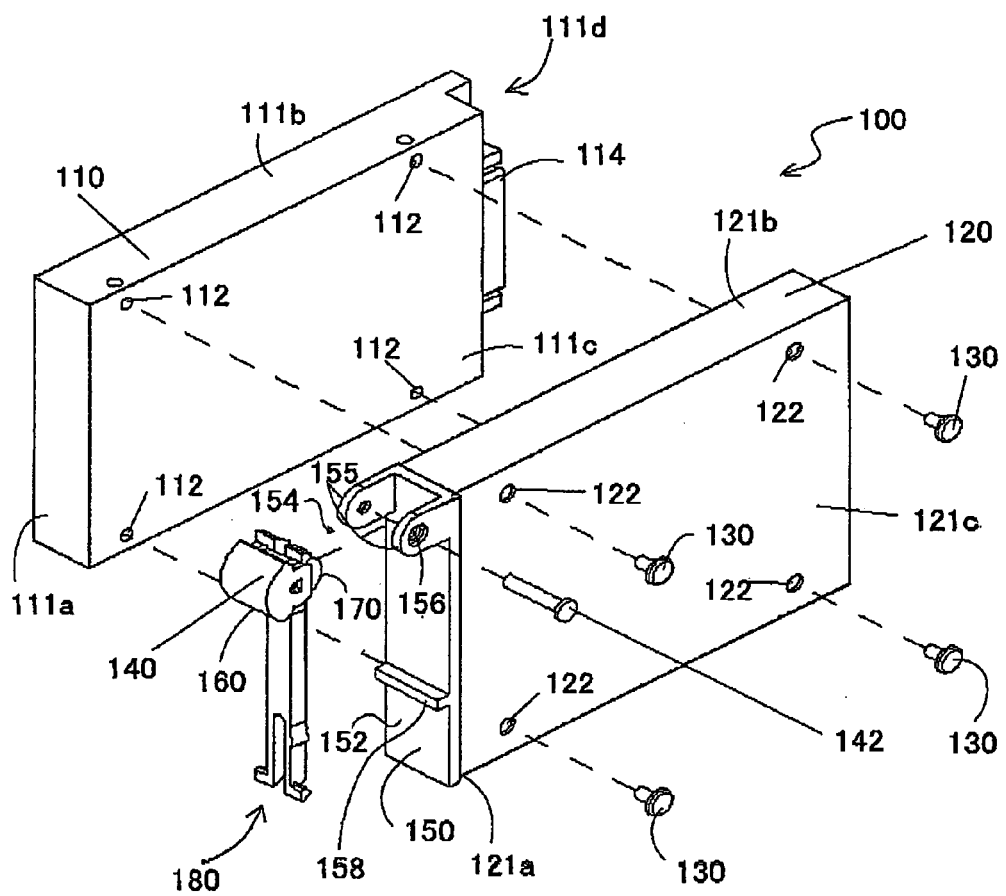
FIG. 2 is an exploded perspective view of the HDD unit shown in FIG. 1.

Referring now to FIGS. 1 and 2, a description will be given of the HDD unit 100. Here, FIG. 2 is an exploded perspective view of the HDD unit 100. The HDD unit 100 serves as a storage that records and reproduces information, and has, as shown in FIG. 2, a 2.5-inch HDD 110, a case or cover 120, four fixing members 130a to 130d (which are screws in this embodiment), and an ejector 140.

The 2.5-inch HDD 110 is a body of the HDD unit 100, and houses 2.5-inch magnetic disc. The 2.5-inch HDD 110 possesses, as shown in FIG. 2, a rectangular parallelepiped shape that has a front surface 111a, a top surface 111b, a side surface 111c, and a rear surface 111d. The 2.5-inch HDD 110 has four attachment holes 112a to 112d, and a connector 114. The attachment holes 112a to 112d are provided in the side surface 111c of the 2.5-inch HDD 110, and serve as screw holes, into which screws 130 are inserted for connections to the case 120. The connector 114 is provided on the rear surface 111d of the 2.5-inch HDD 110, and electrically connected, as shown in FIG. 7, to a connector 211 of the disc array storage 200 for information transmissions and power supplies.

The case 120 protects the 2.5-inch HDD 110, and facilitates its insertion into and its ejection from the electronic apparatus 200. The case 120 is formed, for example, by bending a metal plate having a thickness of 0.4 mm. The case 120 has, as shown in FIG. 2, a front surface 121a, a top surface 121b and a side surface 121c. The case 120 opens on surfaces opposing to the front and side surfaces 121a and 121c, and has a tray shape that receives the 2.5-inch HDD 110. As a result, the 2.5-inch HDD 110 projects in a width direction of the case 120, and the connector 114 projects from the back of the case 120. The case 120 has four attachment holes 122. Each attachment hole 122 is provided in the side surface 121c of the case 120, and is a screw hole, into which the screw 130 is inserted for connections with the 2.5-inch HDD 110.

The screws 130 serve as fixing members that are inserted into the attachment holes 112 and 122, and fix the 2.5-inch HDD 110 onto the case 120. The screw 130 is one exemplary fixing member, and the present invention covers any mechanical means, such as a bolt and a nut. While the instant embodiment configures the screw bead of the screw 130 to be engageable with the guide groove 251 in the guide 250c, the engagement member may be provided as a separate member instead of using the screw 130 as the engagement member with the guide groove 251.

The ejector 140 enables the HDD unit 100 to be inserted into and ejected from the disc array storage 200 for electric connections and disconnections between them, and is provided on the front surface 121c of the case 120. The ejector 140 is commonly used for the HDD unit in the first row that is inserted into and ejected from the disc array storage 200 in the L direction and the HDD unit in the second row that is inserted into and ejected from the disc array storage 200 in the H direction. Since the ejector 140 is commonly used for those HDD units 100 which are inserted and ejected in two orthogonal directions or the L and H directions, only one uniform type of HDD unit may be conveniently manufactured.

The ejector includes a shaft 142, a base 150, blocks 160 and 170, and an arm 180. The shaft 142 acts as a fulcrum as discussed later, when the ejector 140 applies a force to the disc array storage 200.

Figure 3A:
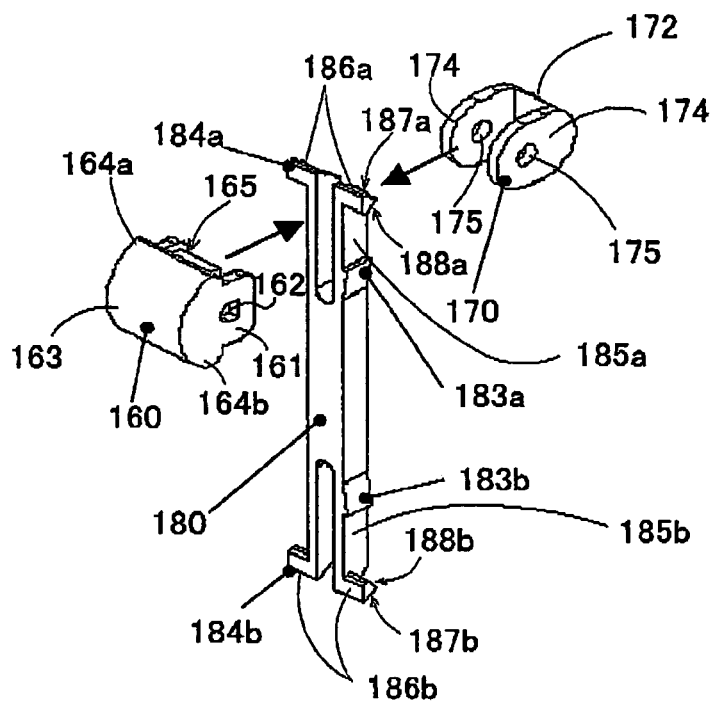
FIG. 3A is an exploded perspective view of an ejector of the HDD unit shown in FIG. 2, and FIGS. 3B and 3C are sectional views of the ejector of different states.

The base 150 has an L shape when viewed from a side surface, and includes a plate member 152, a block member 152, and a support member 158. The base 150 is made, for example, by molding using resin. The plate member 152 has a plate shape, and is attached to the front surface 121a by bonding, jointing, and any other method. Alternatively, the front surface 121a of the case 120 may serve as the plate member 152. The block member 154 rotatably holds the blocks 160 and 170 and arm 180 via the shaft 142, and is provided at the top of the plate member 152. The block member 154 includes a pair of arms 155 that project in a forward direction of the case 120 from the plate member 152, and each arm 155 has an attachment hole 156 through which the shaft 142 perforates. The support member 158 is a rectangular parallelopiped projection, and contacts the arm 180 to restrict its rotation. The support member 158 prevents excessive loads from being applied to the connectors 114 and 211 As shown in FIG. 3A, the block 160 has a T-shaped or mushroom section, and is rotatably attached between the pair of arms 155 of the block member 154. Here, FIG. 3A is an exploded perspective view of the ejector 140. The block 160 has a pair of arms 161, a head 163 and a projection 165.

The pair of arms 161 are made of plate members, and the root of each arm 161 has a perforation hole 162. The perforation hole 162 is connected to the perforation hole 156, through which the shaft 142 perforates. The head 163 has a semi-cylindrical shape, and extends the pair of arms 161 from the head 163. The head 163 has two compression surfaces 164a and 164b. These compression surfaces 164a and 164b serve as points of action to compress the guide 250 of the disc array storage 200 so as to release an electric connection between the HDD unit 100 and the disc array storage 200. Thus, the ejector 140 releases the electric connection between the HDD unit 100 and the disc array storage 200 at two points, and is commonly used for HDD units 100 which are inserted and ejected in different directions.

The projection 165 extends between the roots of the arms 161, and forms a perforation hole 162. The arm 180 is movably provided in a perforation hole formed between the pair of arm 161 and between the projection 165 and a base 172 of the block 170. The projection 165 has a flat surface opposing to the arm 180, and surface-contacts the arm 180. When the rotational force is applied to the arm 180, the arm 180 rotates the projection 165, and the block 160 rotates consequently.

The block 170 is inserted between the arms 161 of the block 160, and holds the arm 180 together with the block 160. In other words, the blocks 160 and 170 form a perforation hole through which the arm 180 displaces. The block 170 may be omitted if the block 160 has such a perforation hole. The block 170 includes a base 172, and a pair of arms 174 that extend from the base 172. Each arm 174 has a perforation hole 175, which is connected to the perforation hole 162.

Figure 3B:
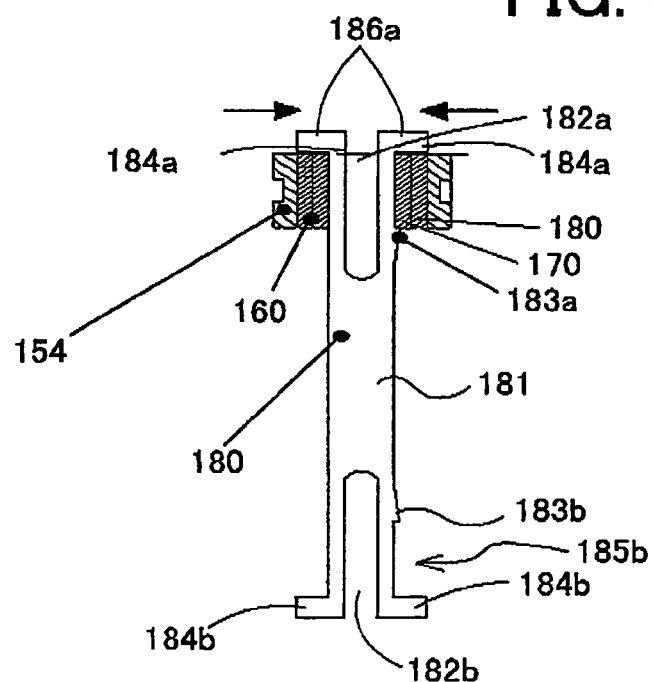
Figure 3C:
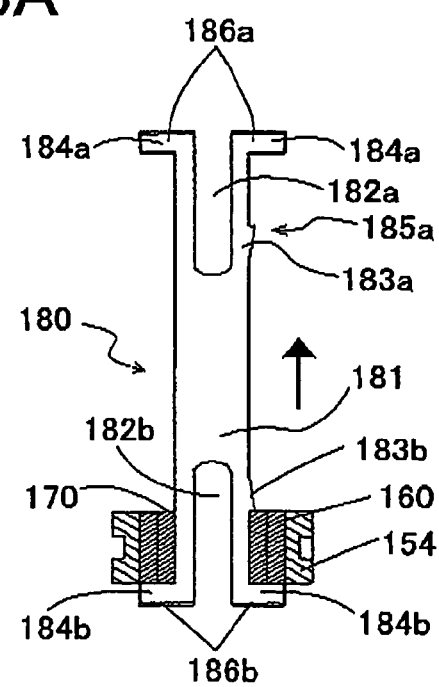

The arm 180 is a rod-shaped member that receives a force for the electric connection and disconnection between the HDD unit 100 and the disc array storage 200. The arm 180 is attached to the case 120 so that the arm 180 can rotate with the blocks 160 and 170 relative to the case 120. The arm 180 is movably inserted into the perforation hole formed by the blocks 160 and 170. The arm 180 is inserted into the perforation hole formed by the blocks 160 and 170 so that the arm 180 can move between a position shown in FIG. 3B and a position shown in FIG. 3C. Here, FIGS. 3B and 3C are sectional views showing two possible positions of the arm 180. The arm 180 has a base 181, a pair of tabs 183a and 183b, and another pair of tabs 184a and 184b.

Grooves 182a and 182b are formed in the base 181 at the top and bottom ends, making a section of the arm 180 X-shaped as shown in FIGS. 3B and 3C. The tabs 183a and 183b are projections formed at one side surface of the base 181. The tabs 183a and 184b are triangular feet that extend outwardly from the top and bottom ends. The tabs 183a, 183b, 184a and 184b form engagement grooves 185a and 185b. The engagement grooves 185a and 185b may be formed at both side surfaces of the base 181. The arm 174 is engaged with the engagement grooves 185a and 185b. The arm 174 and the engagement grooves 185a and 185b may serve as lock means for locking the arm 180 at positions shown in FIGS. 3B and 3C relative to the case 120.

The tabs 184a and 184b serve as unlock means for releasing the lock by the lock means. For example, in FIG. 3B, a user narrows the groove 182a by applying a force in the arrow direction so that the pair of tabs 184a approach to each other, releases an engagement between the engagement groove 185a and the arm 174, and lifts up the arm 180 to a state shown in FIG. 3C.

The tab 184a forms a compression surface 186a and inclined surfaces 187a and 188a. The tab 184b forms a compression surface 186b and inclined surfaces 187b and 188b. The inclined surfaces 187a and 187b contact the plate member 152 of the base 150, and restricts the inclination angle of the arm 180. Thereby, the operability improves because, for example, the HDD unit 100 can be ejected while the inclination angle between the arm 180 and the case 120 is maintained. The compression surfaces 186a and 186b serve as points of action to compress the disc array storage 200 so as to electrically connect the HDD unit 100 to the disc array storage 200. Thus, the ejector 140 electrically connects the HDD unit 100 and the disc array storage 200 to each other at two points, and is commonly used for HDD units 100 which are inserted and ejected in different directions.

Referring now to FIGS. 4 to 7, a description will be given of a method for ejecting the HDD unit 100 in the front row in the L direction shown in FIG. 1 from the disc array storage 200.

Figure 4A:
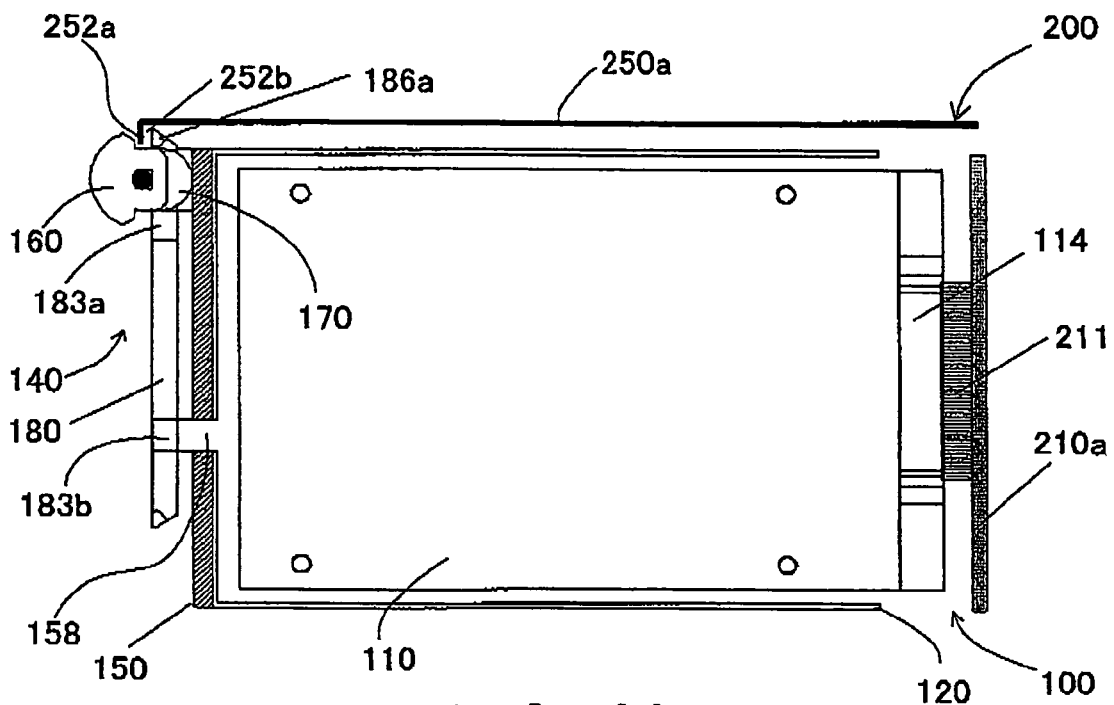
FIGS. 4A and 4B are sectional and perspective views of the front HDD unit shown in FIG. 1 inserted into the disc array storage.
Figure 4B:
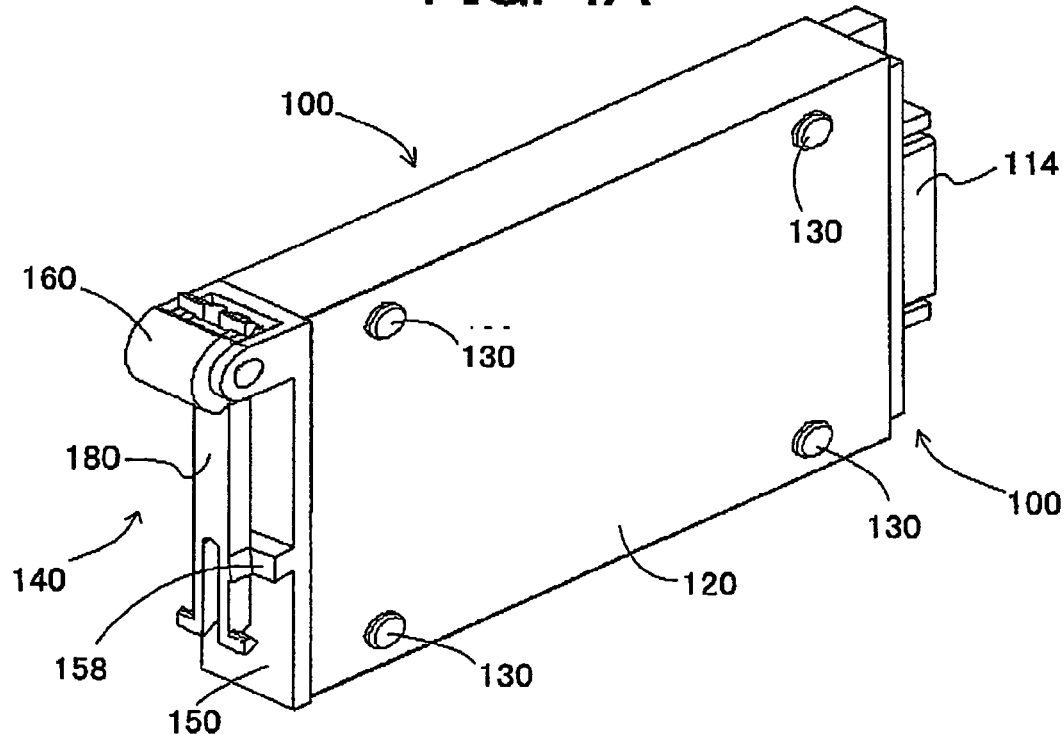

First, when the arm 180 is located at the position shown in FIG. 3B, the HDD unit 100 is loaded into the disc array storage 200 as shown in FIG. 4A. Here, FIG. 4A is a sectional view of the front HDD unit 100 shown in FIG. 3B loaded into the disc array storage 200, and FIG. 4B is a perspective overview of the HDD unit 100 shown in FIGS. 3B and 4A. In this state, the compression surface 186a contacts a rear surface 252b at the front edge of the guide 250a of the disc array storage 200. The support member 158 contacts the arm 180 and restricts its counterclockwise rotation. Moreover, the connector 114 of the HDD unit 100 is electrically connected to the connector 211 connected to the back panel 210a in the disc array storage 200. The state shown in FIG. 4A is a rotational angle of 0° of the arm 180. The arm 180 can freely rotate between 0° and 20°.

Figure 5A:
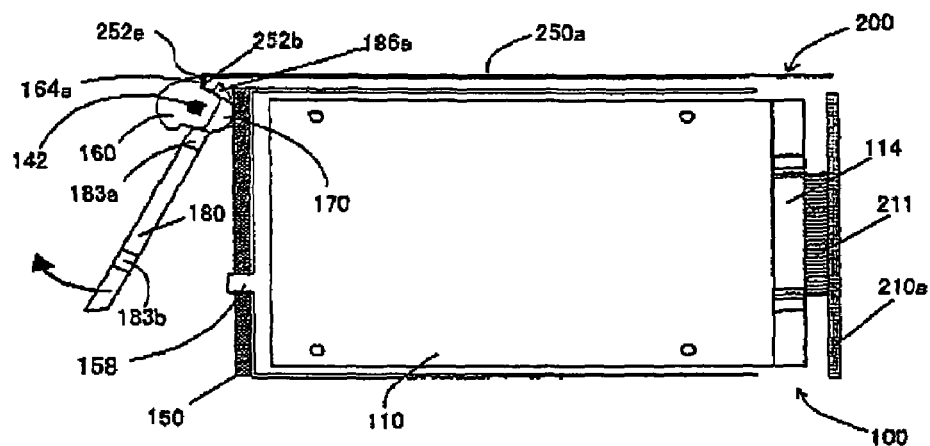
FIG. 5A is a sectional view and FIGS. 5B and 5C are perspective views of the HDD unit that starts an ejection action from the state shown in FIG. 4.
Figure 5B:
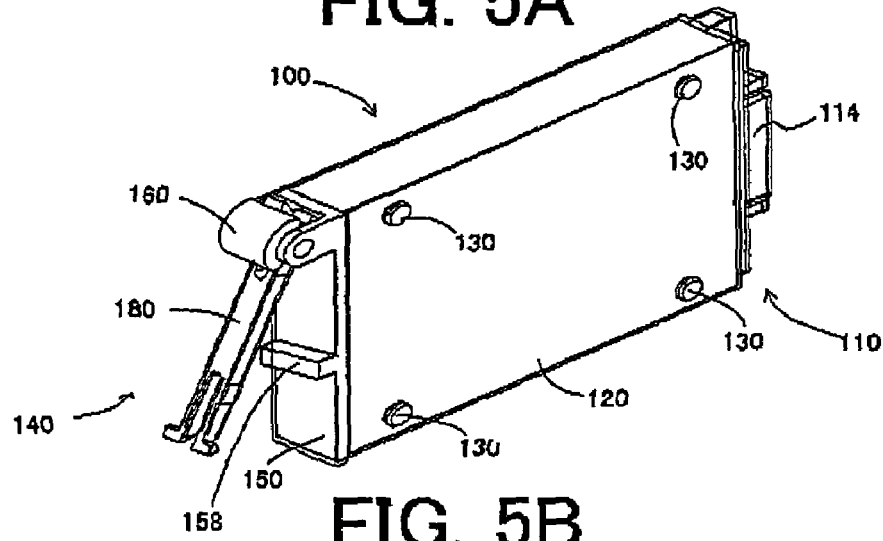
Figure 5C:
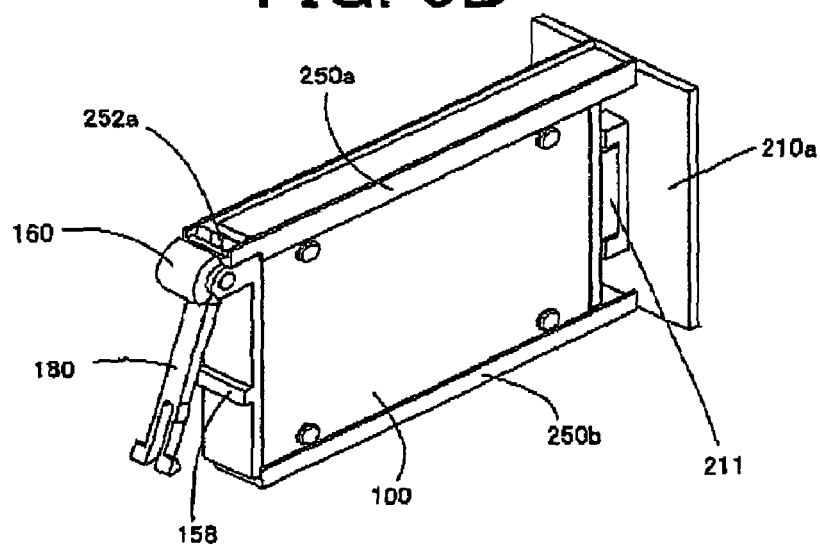

Next, a user lifts a tip of the base 181 of the arm 180 and rotates the arm 180 around the shaft 142 clockwise as shown in FIG. 5A. Then, the compression surface 164a of the block 160 contacts the surface 252a at the edge of the guide 250a. Also in this state, the connector 114 is electrically connected to the connector 211. Here, FIG. 5A is a sectional view showing that the compression surface 164a of the block 160 contacts the guide 250a. FIG. 5B is a perspective overview of the HDD unit 100 shown in FIG. 5A. FIG. 5C is a perspective overview of the state shown in FIG. 5A.

Figure 6A:
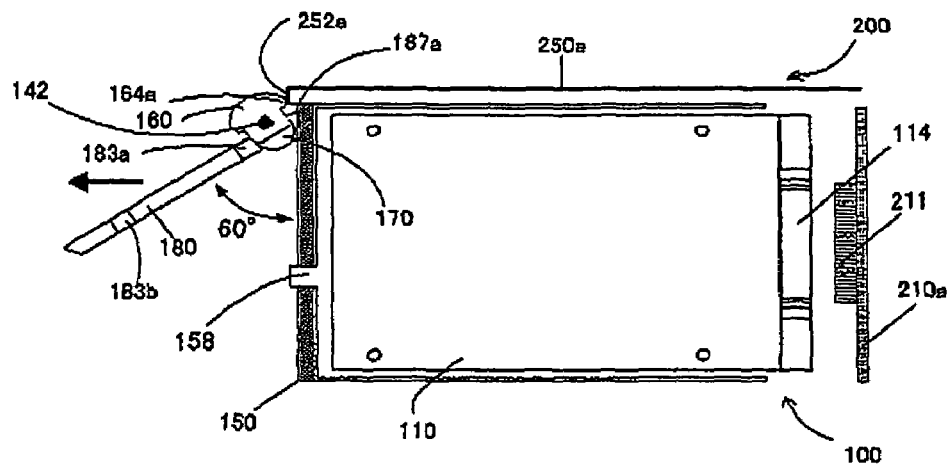
FIG. 6A is a sectional view and FIGS. 6B and 6C are perspective views of the HDD unit that advances the ejection action shown in FIGS. 5A, 5B and 5C.
Figure 6B:
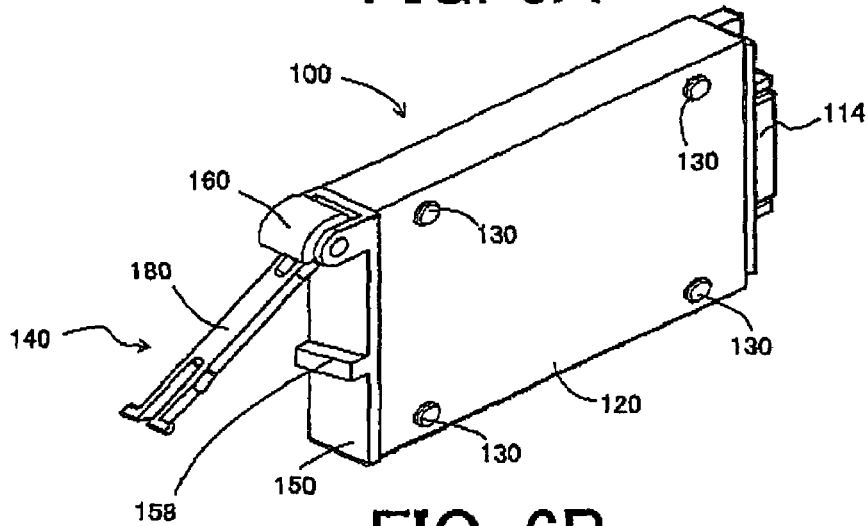
Figure 6C:
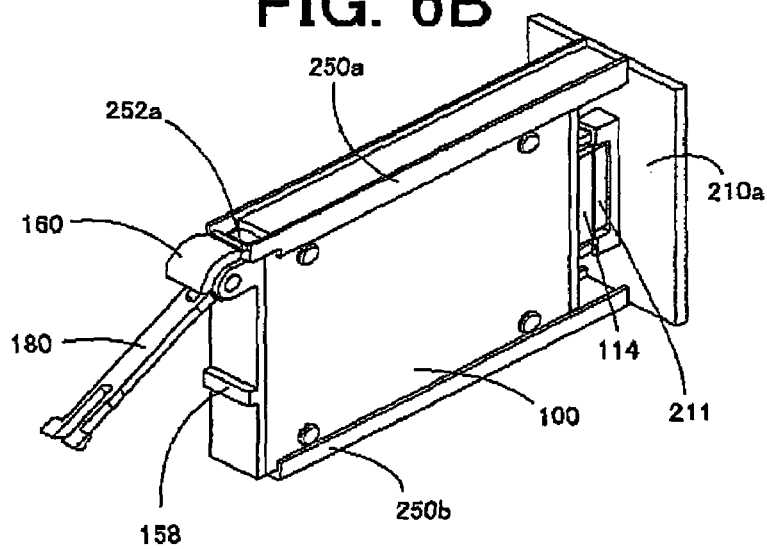

Next, the user lifts up the tip of the base 181 of the arm 180, and further rotates the arm 180 around the shaft 142 clockwise as shown in FIG. 6A. Here, FIG. 6A is a sectional view showing that the compression surface 164a of the block 160 contacts the guide 250 and then the inclined surface 187a contacts the plate member 152. FIG. 6B is a perspective overview of the HDD unit 100 shown in FIG. 6A. FIG. 6C is a perspective overview of the state shown in FIG. 6A.

Then, as a result of that the compression surface 164a that contacts the surface 252a applies the compression force, the block member 154 receives a tension force in the arrow direction by leverage. As a result of the tension force, the electric connection between the connectors 114 and 211 is released. The tension force applied to the block member 154 continues until the inclined surface 187a of the tab 184a contacts the plate member 152. In the instant embodiment, the arm 180 rotates by 60° until the inclined surface 187a contacts the plate member 152.

Figure 7A:
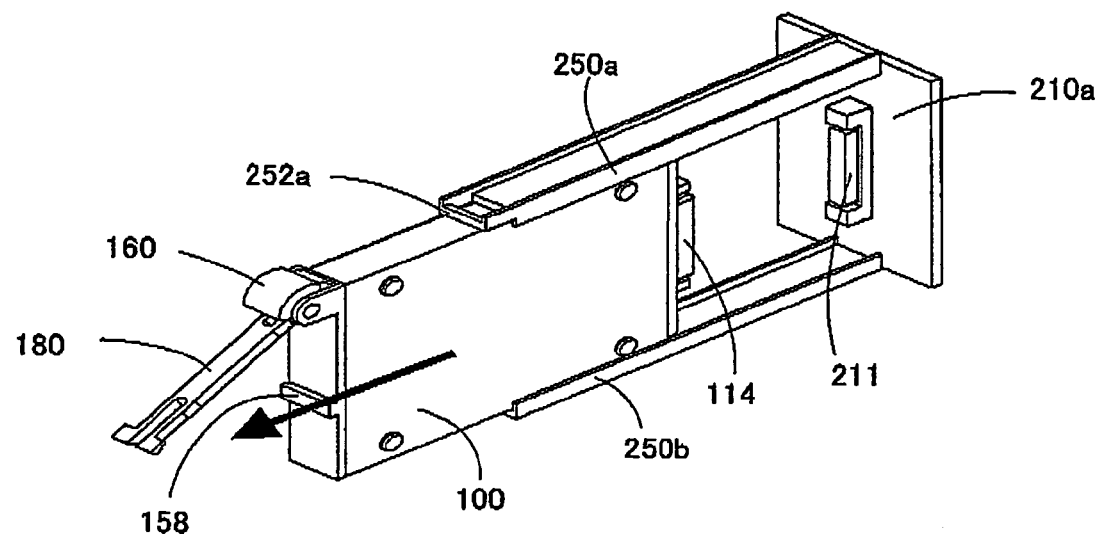
FIGS. 7A and 7B are perspective and sectional views of the HDD unit that advances the ejection action shown in FIGS. 6A, 6B and 6C.
Figure 7B:
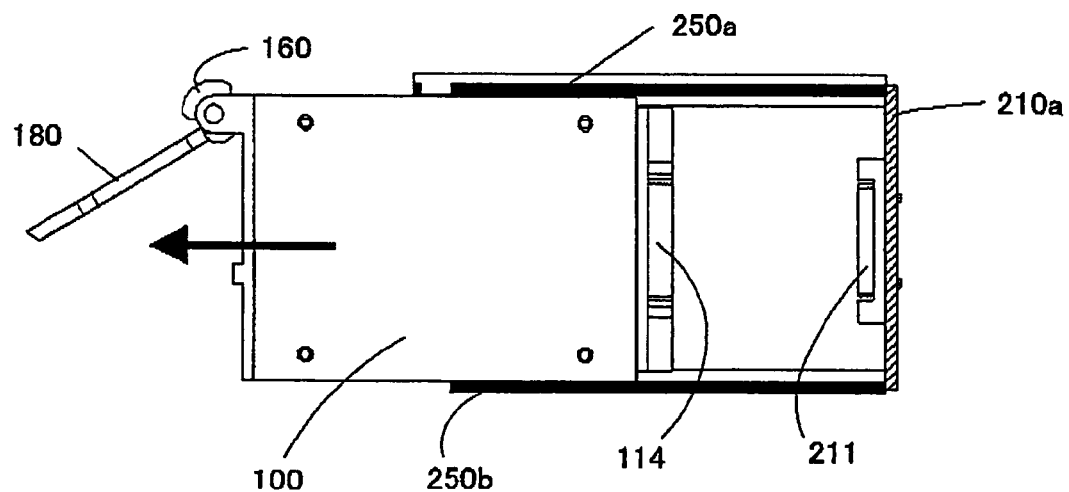

Then, as shown in FIGS. 7A and 7B, the user pulls out the HDD unit 100 in the arrow direction while the inclined surface 187a contacts the plate member 152. Here, FIGS. 7A and 7B are perspective and sectional views for explaining a pulling action of the HDD unit from the state shown in FIG. 6C. Thereby, the HDD unit 100 can be ejected from the disc array storage 200. The user can apply a force approximately symmetrically with respect to the front surface of the HDD unit 100 via the base 181 of the arm 180.

Referring now to FIGS. 8 to 13, a description will be given of a method for ejecting the HDD unit 100 in the front row in the H direction shown in FIG. 1 from the disc array storage 200.

Figure 8:
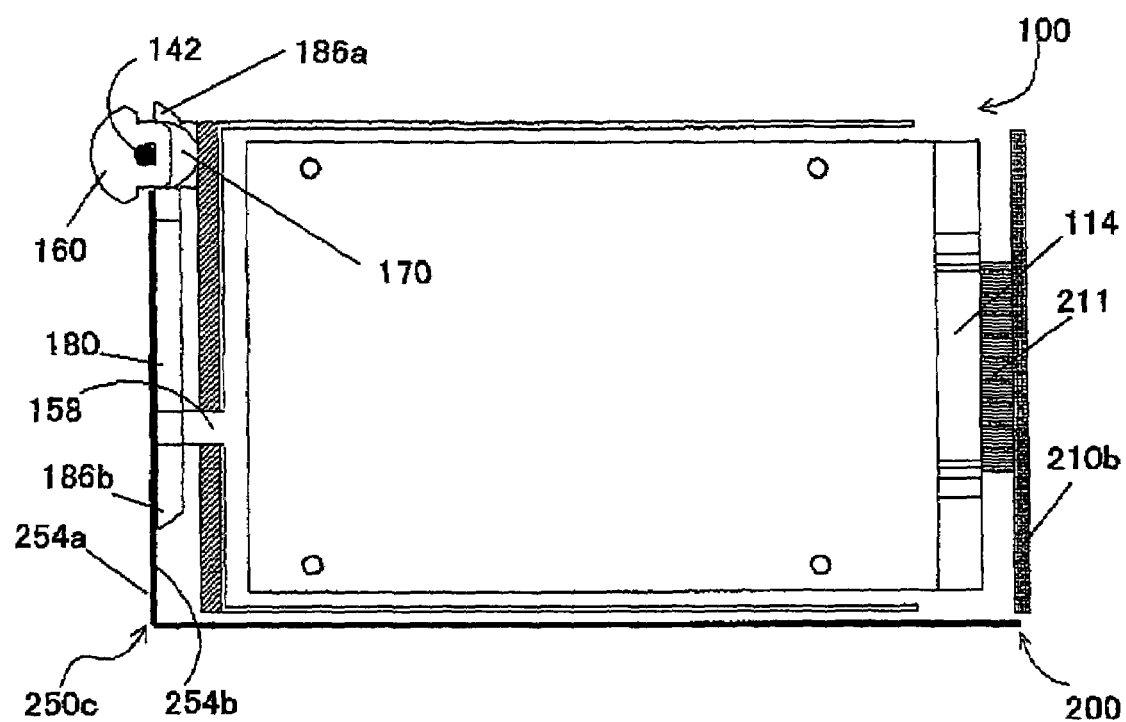
FIG. 8 is a sectional view of the HDD unit of the second row shown in FIG. 1 inserted into the disc array storage.

First, when the arm 180 is located at the position shown in FIG. 3B, the HDD unit 100 is loaded into the disc array storage 200 as shown in FIG. 8. Here, FIG. 8 is a sectional view of the front HDD Aunt 100 shown in FIG. 33 loaded into he disc array storage 200. In this state, the compression surface 186a contacts the rear surface 254b at the front edge of the guide 250c of the disc array storage 200. The support member 158 contacts the arm 180 and restricts its counterclockwise rotation. Moreover, the connector 114 of the HDD unit 100 is electrically connected to the connector 211 connected to the back panel 210 in the disc array storage 200.

Figure 9A:
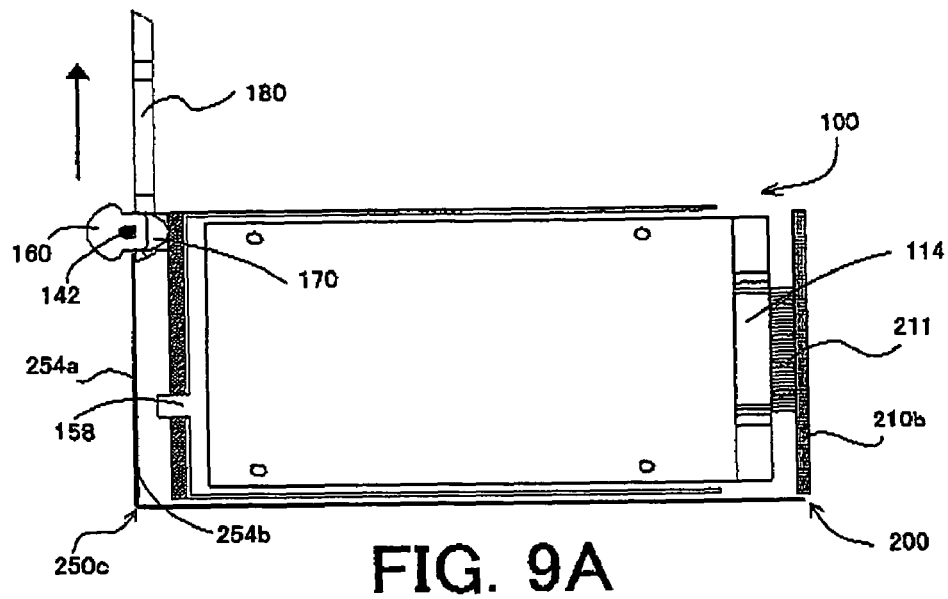
FIG. 9A is a sectional view and FIGS. 9B and 9C are perspective views of the HDD unit that starts an ejection action from the state shown in FIG. 8.
Figure 9B:
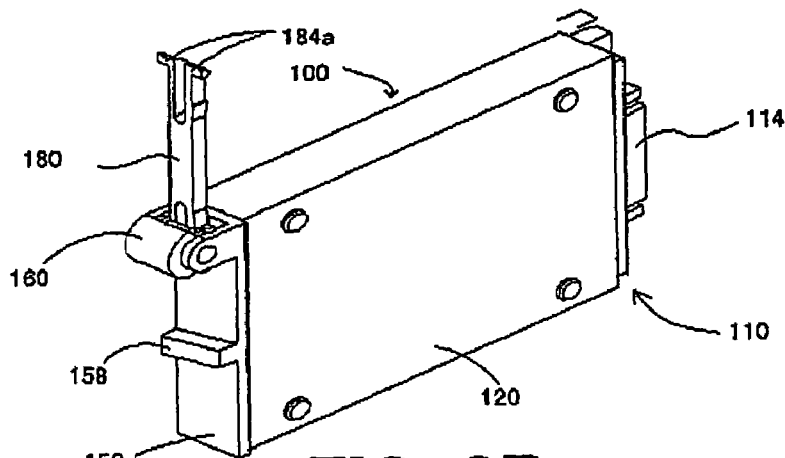
Figure 9C:
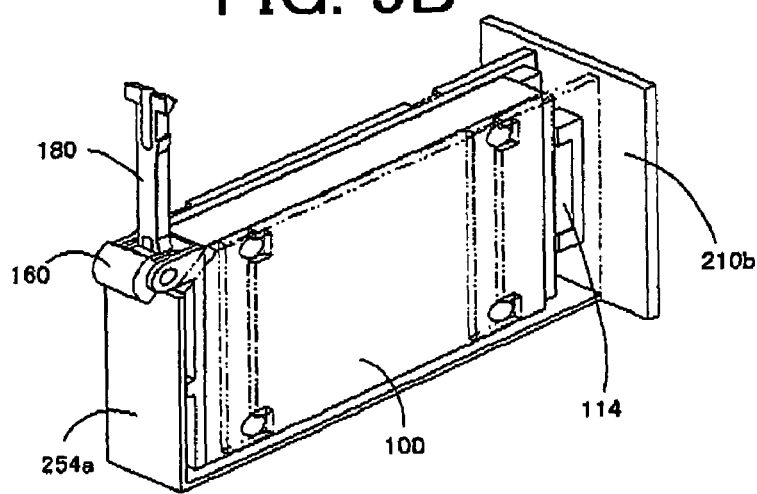

Then, the user narrows the tabs 184a of the arm 180 as shown in FIG. 3B, and releases the engagement between the block 170 and the guide groove 185a, lifts up the tabs 184a upwardly as shown by an arrow in FIG. 3C, and engages the block 170 with the engagement groove 185b. FIGS. 9A to 9C show this state. In other words, FIG. 9A is a sectional view showing that the disc array storage 200 accommodates the HDD unit 100 that displaces from the state shown in FIG. 3B to the state shown in FIG. 3C. FIG. 9B is a perspective overview of the HDD unit 100 shown in FIG.

9A. FIG. 9C is a perspective overview of the state shown in FIG. 9A. Here, the state shown in FIG. 9A is the rotational angle of 0° of the arm 180. The arm 180 can freely rotate between 0° and 20°.

Next, the user rotates the tip of the base 181 and thus revolves the arm 180 around the shaft 142 counterclockwise as shown in FIG. 10A. Then, the compression surface 164b of the block 160 contacts the surface 234a at the edge of the guide 250c. Also in this state, the connector 114 is electrically connected to the connector 211. Here, FIG. 10A is a sectional view showing that the compression surface 164b of the block 160 contacts the guide 250c. FIG. 10B is a perspective overview of the HDD unit 100 shown in FIG. 10A. FIG. 10C is a perspective overview of the state shown in FIG. 10A.

Figure 11A:
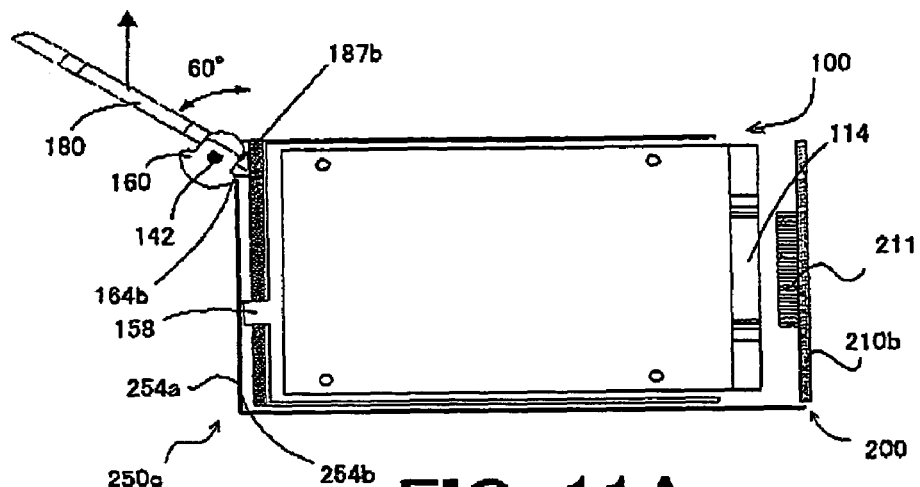
FIG. 11A is a sectional view and FIGS. 11B and 11C are perspective views of the HDD unit that advances the ejection action shown in FIGS. 10A, 10B and 10C.
Figure 11B:
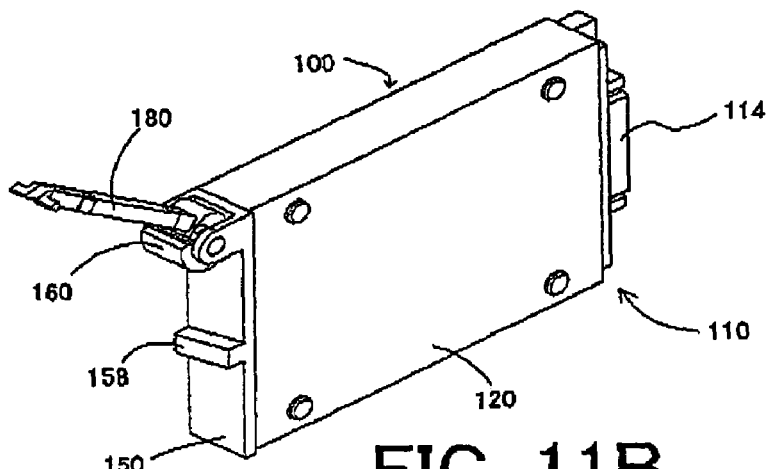
Figure 11C:
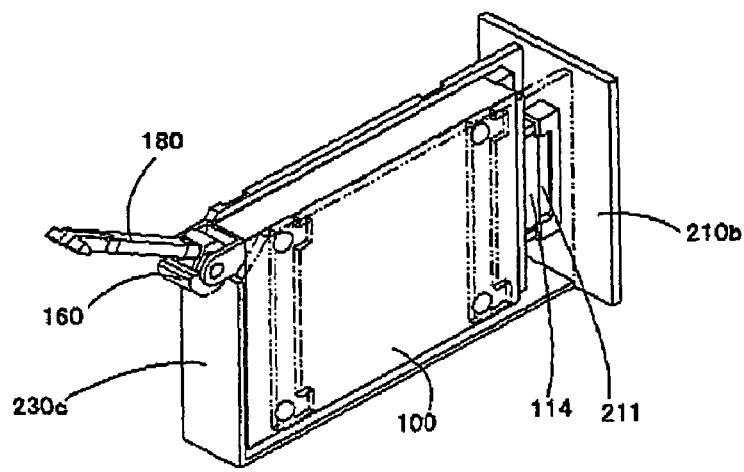

Next, the user further rotates the tip of the base 181 of the arm 180around the shaft 142 counterclockwise as shown in FIG. 11A. Here, FIG. 11A is a sectional view showing that the compression surface 164b of the block 160 contacts the surface 254a at the front edge of the guide 250c and then the inclined surface 187b contacts the plate member 152. FIG. 11B is a perspective overview of the HDD unit 100 shown in FIG. 11A. FIG. 11C is a perspective overview of the state shown in FIG. 11A.

Figure 12:
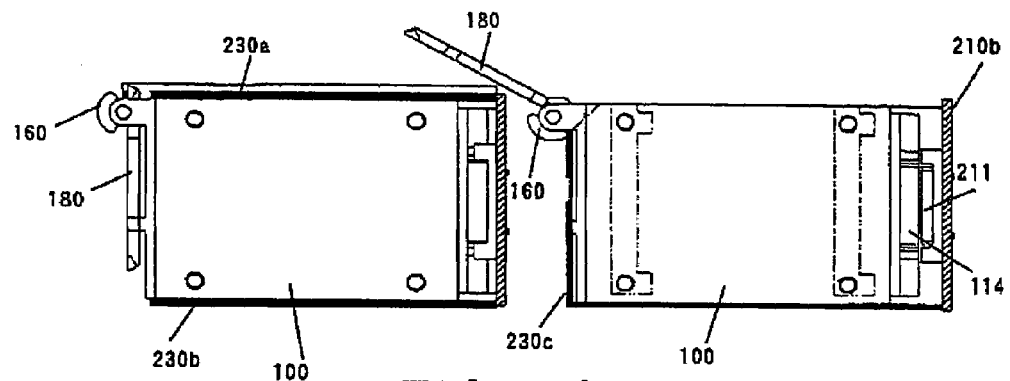
FIG. 12 is a sectional view showing a relationship between the front HDD unit and the inner HDD unit.

Then, as a result of that the compression surface 164b that contacts the surface 252c applies the compression force, the block member 154 receives a tension force in the left direction by leverage As a result of this tension force, the electric connection between the connectors 114 and 211 is released. The tension force applied to the block member 154 continues until the inclined surface 187b of the tab 184a contacts the plate member 152. In the instant embodiment, the arm 180 rotates by 60° until the inclined surface 187a contacts the plate member 152 FIG. 12 shows the positional relationship with the front HDD unit 100.

Figures 13A, 13B:
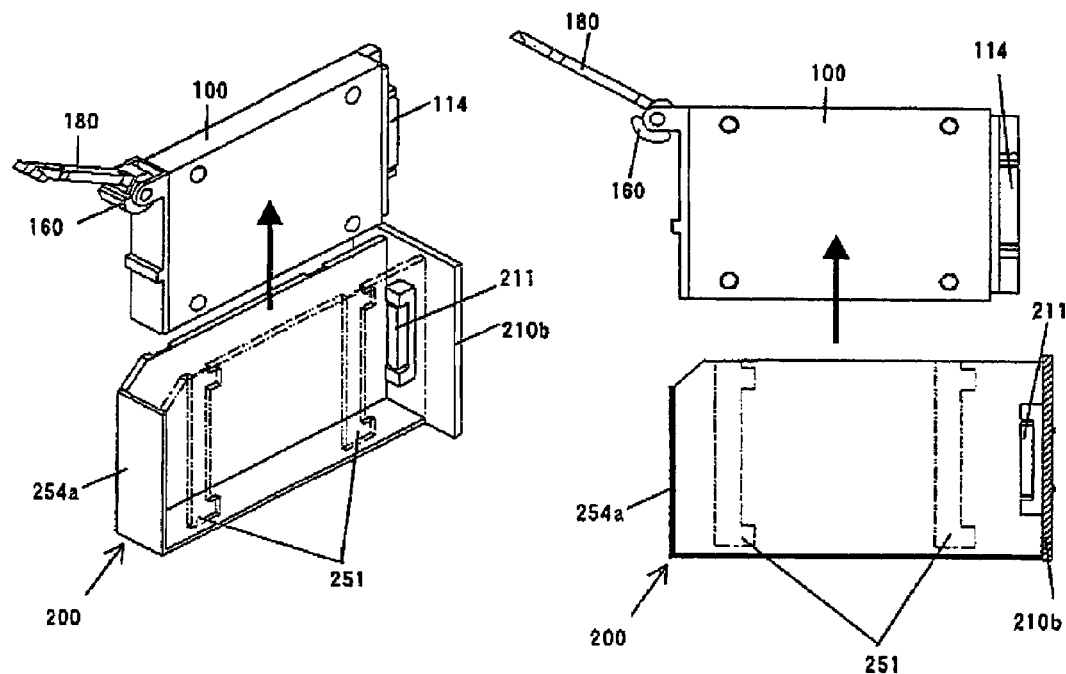
FIGS. 13A and 13B are perspective and sectional-views of the HDD unit that advances the ejection action shown in FIGS. 11A, 11B and 11C.

Then, as shown in FIGS. 13A and 13B, the user pulls out the HDD unit 100 in the arrow direction while the inclined surface 187b contacts the plate member 152. Thereby, the HDD unit 100 can be ejected from the disc array storage 200. The user can apply a force approximately symmetrically with respect to the front surface of the HDD unit 100 via the base 181 of the arm 180. Here, FIGS. 13A and 13B are perspective and sectional views for explaining a pulling action of the HDD unit from the state shown in FIG. 11C.

Referring now to FIGS. 14 to 17, a description will be given of a method for inserting the HDD unit 100 in the front row in the L direction shown in FIG. 1 into the disc array storage 200.

Figures 14A, 14B:
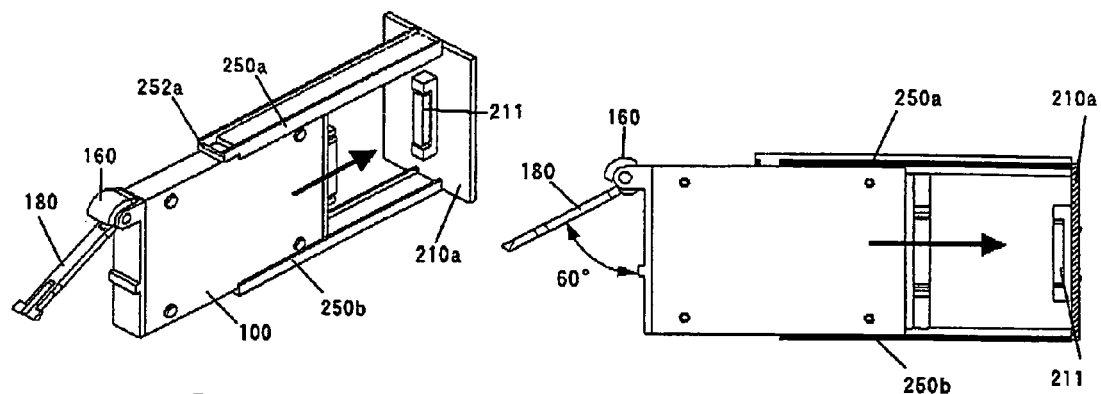
FIGS. 14A and 14B are perspective and sectional views of the front HDD unit that starts an insertion action from the state shown in FIG. 1.
Figures 15A, 15B:
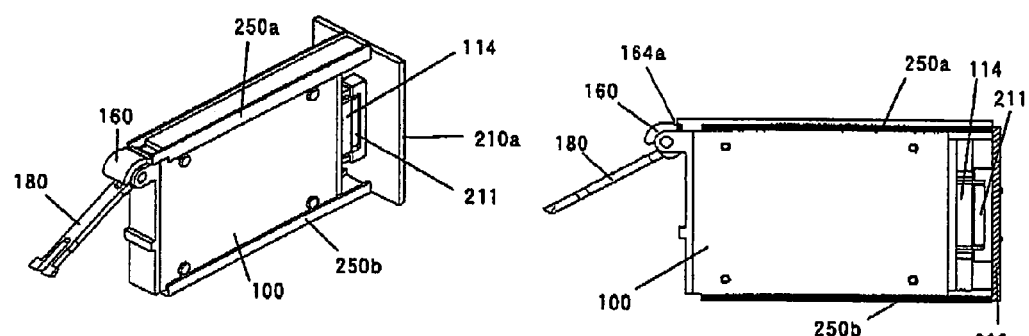
FIGS. 15A and 15B are perspective and sectional views of the HDD unit that advances the ejection action shown in FIGS. 14A and 14B.

First, the user starts inserting the front HDD unit 100 along the guides 250a and 250b of the disc array storage 200. FIGS. 14A and 14B are perspective and sectional views showing this state. In this state, the inclined surface 187a of the tab 184a of the arm 180 contacts the plate member 152 and the rotational angle of the arm 180 is 60° as shown in FIG. 15B. In this state, the connectors 114 and 211 are not electrically connected to each other.

Next, the compression surface 164a of the block 160 contacts the front surface 252a at the front edge of the guide 250a. FIGS. 15A and 15B are perspective and sectional views showing this state. Also in this state, the inclined surface 187a of the tab 184a of the arm 180 contacts the plate member 152 and the rotational angle of the arm 180 is 60° as shown in FIG. 15B. In this state, the connectors 114 and 211 are not electrically connected to each other.

Figures 16A, 16B:
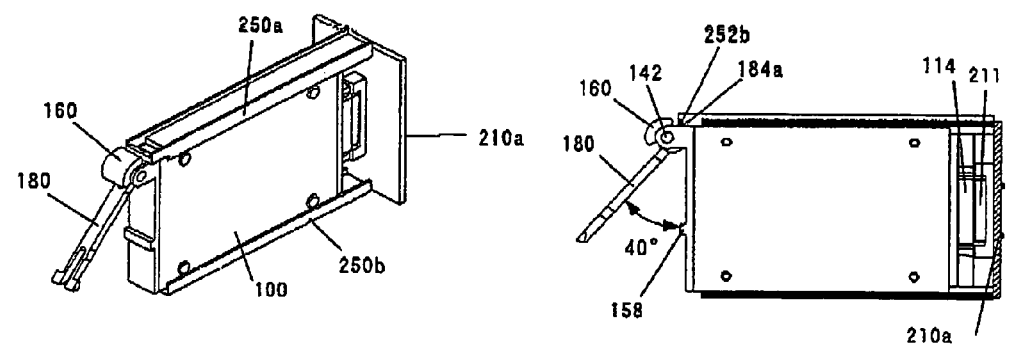
FIGS. 16A and 16B are perspective and sectional views of the HDD unit that advances the ejection action shown in FIGS. 15A and 15B.

Next, the user rotates the tip of the arm 180 towards the HDD unit 100 side around the shaft 142, counterclockwise as shown in FIG. 16A. Then, the compression surface 186a of the tab 184a of the arm 180 contacts the rear surface 252b at the front edge of the guide 250a. The block member 154 receives a squeezing force as shown by an arrow in FIG. 16B by leverage. This squeezing force electrically contacts the connectors 114 and 211 to each other. The squeeze continues until the compression surface 186a surface-contacts the rear surface 252b. FIG. 16B shows a state that the arm 180 rotates counterclockwise by 20° from the state shown in FIG. 15B.

Figure 17A:
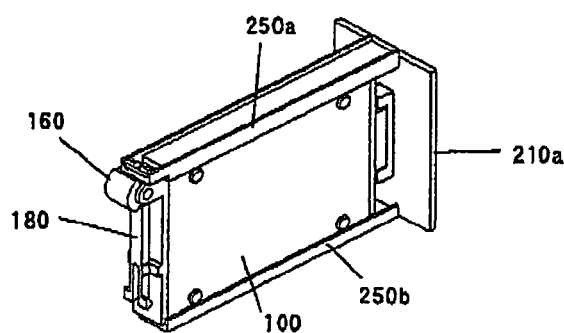
FIGS. 17A and 17B are perspective and sectional views of the HDD unit that advances the ejection action shown in FIGS. 16A and 16B.
Figure 17B:
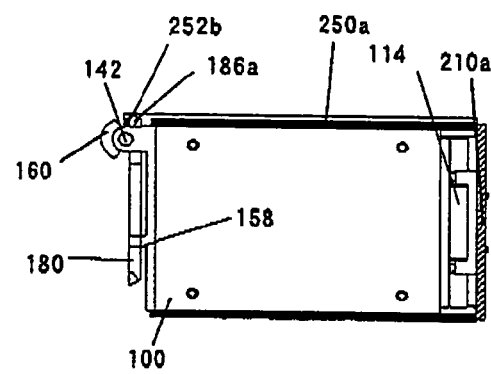

FIG. 17A is a perspective view showing a complete electric connection between the connectors 114 and 211 after the user rotates the arm 180, and FIG. 17B is its sectional view. In this state, the support member 158 contacts the arm 180 and restricts its counterclockwise rotation.

Referring now to FIGS. 18 to 21, a description will be given of a method for inserting the HDD unit 100 in the front row in the H direction shown in FIG. 1 into the disc array storage 200.

Figure 18A:
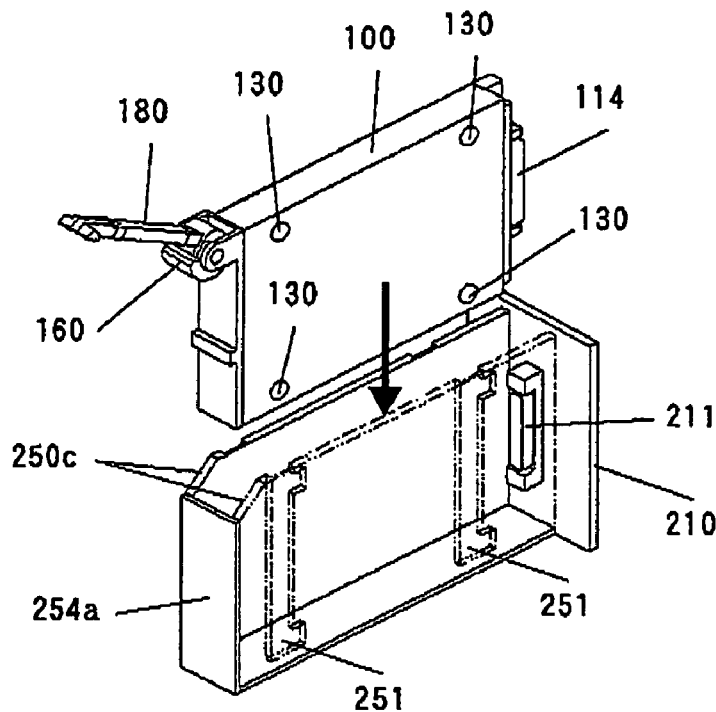
FIGS. 18A and 18B are perspective and sectional views of the inner HDD unit that starts an insertion action from the state shown in FIG. 1.
Figure 18B:
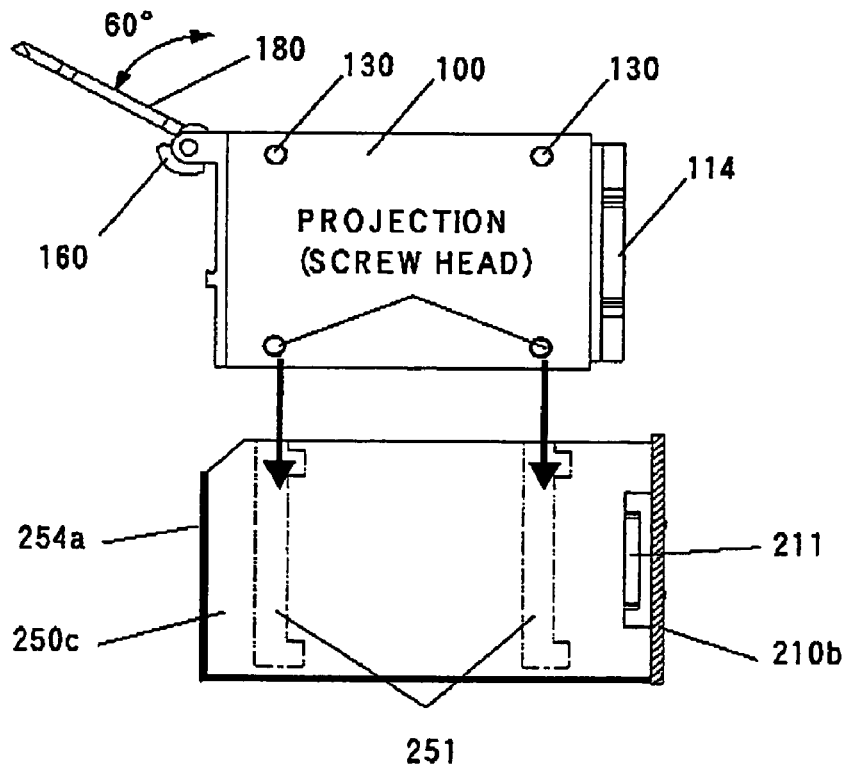

First, the user starts inserting the inner HDD unit 100 along the guides 250c and 250b of the disc array storage 200. The screw heads of the screws 130 are guided along the perpendicular portions of the guide grooves 251. FIGS. 18A and 18B are perspective and sectional views showing this state. In this state, the inclined surface 187b of the tab 184b of the arm 180 contacts the plate member 152 and the rotational angle of the arm 180 is 60° as shown in FIG. 18B. The user can apply the symmetrical force to the HDD unit 100 through the base 181 of the arm 180 with respect to the front surface of the HDD unit 100.

Figures 19A, 19B:
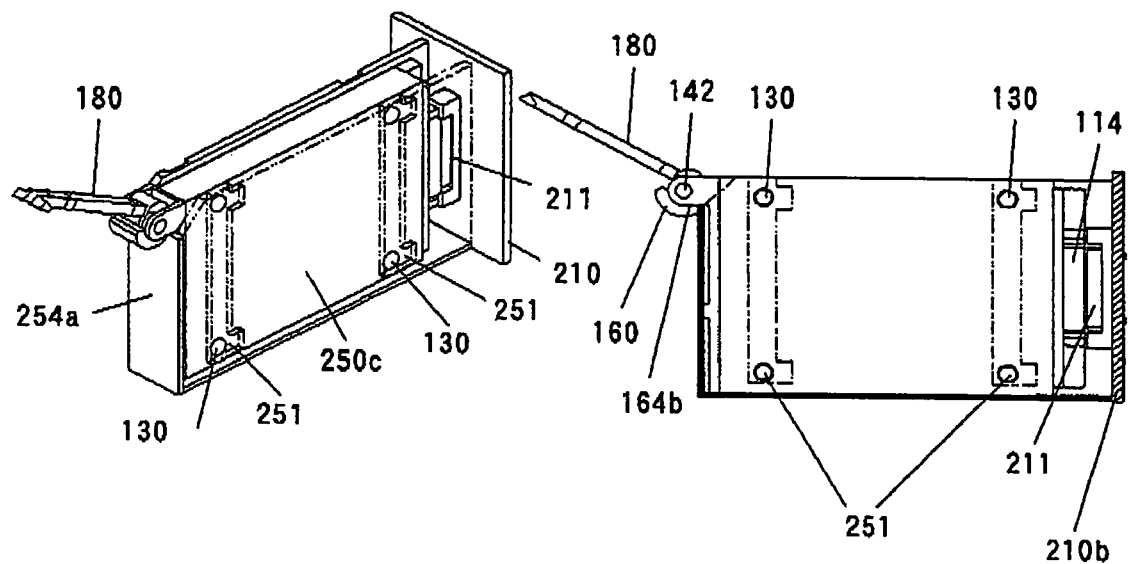
FIGS. 19A and 19B are perspective and sectional views of the HDD unit that advances the ejection action shown in FIGS. 18A and 18B.

Next, the compression surface 164b of the block 160 contacts the front edge 254 of the guide 250c. FIGS. 19A and 19B are perspective and sectional views showing this state. Also in this state, the inclined surface 187b of the tab 184a of the arm 180 contacts the plate member 152 and the rotational angle of the arm 180 is 60° as shown in FIG. 19B. In this state, the connectors 114 and 211 are not electrically connected to each other.

Next, the user rotates the tip of the arm 180 towards the HDD unit 100 side around the shaft 142, counterclockwise as shown in FIG. 19A. Then, the compression surface 186b of the tab 184b of the arm 180 contacts the rear surface 252b at the front edge 254 of the guide 250c. The block member 154 receives a squeezing force as shown by an arrow in FIG. 19B by leverage. This squeezing force electrically contacts the connectors 114 and 211 to each other. The squeeze continues until the compression surface 186b surface-contacts the rear surface 256b. FIGS. 20A and 20B are perspective and sectional views showing the complete electrical connection between the connectors 114 and 211 after rotating the arm 180.

Then, the user compresses the bottom of the arm 180 so that the tabs 184b approach to each other, releases the engagement between the block 170 and the engagement groove 185a, displaces the tab 184b from the state shown in FIG. 3C to the state shown in FIG. 3C, and engages the block 170 with the engagement groove 185a. FIGS. 21A and 21B are perspective and sectional views showing this state. In this state, the support member 158 contacts the arm 180 and restricts its counterclockwise rotation.

Further, the present invention is not limited to these preferred embodiments, and various variations and modifications may be made without departing from the scope of the present invention. For example, the above embodiment discusses the unit as the HDD unit and the electronic apparatus as the disc array storage, but the unit is applicable to a network unit and a disc drive in addition to the HDD.

Thus, the present invention can provide a small ejector that attaches each of units of plural rows to and ejects that unit from the electronic apparatus, the unit having this ejector, and the electronic apparatus that removably accommodates the unit.

What is claimed is:

1. An ejector comprising:
   a block attached rotatably to a unit, said block including first and second compression members, each of which compresses an electronic apparatus so as to release an electric connection between the unit and the electronic apparatus; and
   an arm rotatable with said block and attached to the unit so that said arm displaces relative to said block, said arm including third and fourth compression members, each of which compresses an electronic apparatus so as to electrically connect the unit and the electronic apparatus to each other,
   wherein said block and said arm compress the electronic apparatus via different compression members as a displacement state and a rotational direction of said arm displacement relative to said block.

2. An elector according to claim 1,
   wherein said arm is displaceable between first and second positions relative to the unit,
   wherein as said arm rotates from the first position in a first direction, the first compression member of said block compresses the electronic apparatus, and as said arm rotates from the first position in a second direction opposite to the first direction, the third and fourth compression members of said arm compresses the electronic apparatus.

3. An ejector according to claim 2, further comprising:
   a lock member that locks said arm at the first and second positions relative to the unit; and
   an unlock member that releases a lock by said lock member.

4. An ejector according to claim 3, wherein said lock member includes:
   a fixing member attached to the unit; and
   an engagement member engageable with said fixing member and formed on said arm, and
   wherein said unlock member has an elastically deformable X shape that enables said arm to deform and releases an engagement between said fixing member and said engagement member.

5. An ejector according to claim 2, wherein the third direction is the second direction, and the fourth direction is the first direction.

6. An ejector according to claim 2, wherein said first and third compression members contact front and back surface of the electronic apparatus, and said second and fourth compression members contact front and back surface of the electronic apparatus.

7. An ejector according to claim 1, wherein said block has a T-shaped section or mushroom-shaped section.

8. An ejector according to claim 1, wherein said arm is a rod-shaped member, one end of said arm at the first position being engaged with said block, the other end of said arm at the second position being engaged with said block.

9. An ejector according to claim 1, further comprising a rotation restricting member that restricts a rotation of said arm towards the unit.

10. An ejector according to claim 1, further comprising a rotation restricting member that restricts a rotation of said arm by contacting the unit or a member fixed onto the unit.

11. An ejector used for an electronic apparatus that arranges two rows of units, said ejector enabling the two rows of units to be inserted into the electronic apparatus in directions orthogonal to each other, and to be ejected from the electronic apparatus in directions orthogonal to each other, said ejector comprising:
    a first member that includes two operational members located at different positions, and compresses an electronic apparatus using one of the two operational members so as to release an electronic connection between a unit and the electronic apparatus; and
    a second member that is rotatably attached to said first member and displaces relative to said first member, includes two other operational members located at different positions, and compresses the electronic apparatus using one of the two other operational members so as to electrically connect the unit and the electronic apparatus to each other;
    wherein one of the two operational members in said first member and one of the two other operational members in said second member are used to insert one of the two rows of units into the electronic apparatus and to eject the one of the two rows of units from the electronic apparatus, and
    wherein the other of the two operational members in said first member and the other of the two other operational members in said second member are used to insert the other of the two rows of units into the electronic apparatus and eject the other of the two rows of units from the electronic apparatus.

12. A unit that comprises an ejector that includes a block attached rotatably to a unit, said block including first and second compression members, each of which compresses an electronic apparatus so as to release an electric connection between the unit and the electronic apparatus; and an arm rotatable with said block and attached to the unit so that said arm displaces relative to said block, said arm including third and fourth compression members, each of which compresses an electronic apparatus so as to electrically connect the unit and the electronic apparatus to each other, wherein said block and said arm compress the electronic apparatus via different compression members as a displacement state and a rotational direction of said arm displacement relative to said block.

13. An electronic apparatus that accommodates plural units in at least two rows, the units of the at least two rows being inserted into and ejected from said electronic apparatus in orthogonal directions, said electronic apparatus comprising:
    a first back panel electrically connectible to a unit in a first row;
    a second back panel electrically connectible to a unit in a second row;
    a third back panel electrically connectible to said second back panel; and
    a rigid relay board that connects said first back panel to said third back panel,
    wherein power is supplied to each of the units in the first and second rows via said third back panel and signals are transmitted between said third back panel and each of the units in the first and second rows.

14. An electronic apparatus according to claim 13, wherein said first, second and third back panels are arranged substantially parallel to each other.

15. An electronic apparatus according to claim 13, wherein the unit includes a first engagement member on a surface parallel to a longitudinal direction of the unit, wherein said electronic apparatus further comprises:
- a first guide that is engageable with the unit in the first row and guides the unit in the first row in the longitudinal direction of the unit;
- a second engagement member enageable with the first engagement member; and
- a second guide that is engageable with the unit in the second row and guides the unit in the second row in a direction perpendicular to the longitudinal direction of the unit.

16. An electronic apparatus that accommodates plural units in at least two rows, the units of the at least two rows being inserted into and ejected from the electronic apparatus in orthogonal directions, said electronic apparatus comprising:
- a first back panel electrically connectible to a unit in a first row;
- a second back panel electrically connectible to a unit in a second row;
- a third back panel electrically connectible to said second back panel; and
- a relay board that connects the first back panel to said third back panel, wherein power is supplied to each of the units in the first and second rows via the third back panel and signals are transmitted between the third back panel and each of the units in the first and second rows, and wherein
- each unit includes an ejector, said ejector including a block attached rotatably to a unit,
- said block including first and second compression members, each of which compresses an electronic apparatus so as to release an electric connection between the unit and the electronic apparatus; and
- an arm rotatable with said block and attached to the unit so that said arm displaces relative to said block, said arm including third and fourth compression members, each of which compresses an electronic apparatus so as to electrically connect the unit and the electronic apparatus to each other, wherein
- said block and said arm compress the electronic apparatus via different compression members as a displacement state and a rotational direction of said arm displacement relative to said block.

17. An electronic apparatus according to claim 16, further comprising a fixing member that fixes the arm when the unit is loaded into said electronic apparatus.

18. A rack mount unit that removably accommodates an electronic apparatus that accommodates plural units in at least two rows, the units of the at least two rows being inserted into and ejected from said electronic apparatus in orthogonal directions, wherein said electronic apparatus comprises:
- a first back panel electrically connectible to a unit in a first row:
- a second back panel electrically connectible to a unit in a second row:
- a third back panel electrically connectible to said second back panel: and
- a rigid relay board that connects said first back panel to said third back panel,
- wherein power is supplied to each of the units in the first and second rows via said third back panel and signals are transmitted between said third back panel and each of the units in the first and second rows.

19. An electronic apparatus comprising:
- an arrangement of two rows of individual units,
- an operational means for inserting and ejecting the individual units from the electronic apparatus in directions orthogonal to each other,
- said operational means further comprising:
- a first member that includes two operational members located at different positions and rotatably attached to one of the units, and compresses the electronic apparatus using one of the two operational members so as to release an electronic connection between the unit and the electronic apparatus; and
- a second member rotatably attached to said first member and displaces relative to said first member and that includes two other operational members located at different positions, and compresses the electronic apparatus using one of the two other operational members so as to electrically connect the unit and the electronic apparatus to each other.

* * * * *